United States Patent
Kondo et al.

(10) Patent No.: US 12,333,695 B2
(45) Date of Patent: Jun. 17, 2025

(54) SAMPLE OBSERVATION SYSTEM AND IMAGE PROCESSING METHOD

(71) Applicant: Hitachi High-Tech Corporation, Tokyo (JP)

(72) Inventors: Naoaki Kondo, Tokyo (JP); Minoru Harada, Tokyo (JP); Yohei Minekawa, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 477 days.

(21) Appl. No.: 17/802,161

(22) PCT Filed: Jan. 8, 2021

(86) PCT No.: PCT/JP2021/000484
§ 371 (c)(1),
(2) Date: Aug. 25, 2022

(87) PCT Pub. No.: WO2021/176841
PCT Pub. Date: Sep. 10, 2021

(65) Prior Publication Data
US 2023/0005123 A1   Jan. 5, 2023

(30) Foreign Application Priority Data
Mar. 6, 2020   (JP) ................... 2020-038745

(51) Int. Cl.
*G06T 7/00* (2017.01)
*G06V 10/75* (2022.01)

(52) U.S. Cl.
CPC .......... *G06T 7/0002* (2013.01); *G06V 10/751* (2022.01); *G06T 2207/10061* (2013.01);
(Continued)

(58) Field of Classification Search
CPC . G06T 2207/10061; G06T 2207/30141; G06T 2207/10056; G06T 2207/20084;
(Continued)

(56) References Cited

U.S. PATENT DOCUMENTS 10,997,713 B2 * 5/2021 Morino ................... G06T 7/11
2005/0002560 A1   1/2005 Yamamoto et al.
(Continued)

FOREIGN PATENT DOCUMENTS

CN   110619618 A * 12/2019 ........... G06T 7/0004
JP   08-136466 A   5/1996
(Continued)

OTHER PUBLICATIONS

Olaf Ronneberger, et al. "U-Net: Convolutional Networks for Biomedical Image Segmentation" arXiv:1505.04597v1, May 18, 2015.
(Continued)

*Primary Examiner* — Utpal D Shah
*Assistant Examiner* — Jack Peter Kraynak
(74) *Attorney, Agent, or Firm* — MATTINGLY & MALUR, PC

(57) ABSTRACT

The invention provides a sample observation system including a scanning electron microscope and a calculator. The calculator: (1) acquires a plurality of images captured by the scanning electron microscope; (2) acquires, from the plurality of images, a learning defect image including a defect portion and a learning reference image not including the defect portion; (3) calculates estimation processing parameters by using the learning defect image and the learning reference image; (4) acquires an inspection defect image including a defect portion; and (5) estimates a pseudo reference image by using the estimation processing parameters and the inspection defect image.

19 Claims, 17 Drawing Sheets

(52) U.S. Cl.
CPC ............... *G06T 2207/20084* (2013.01); *G06T 2207/30141* (2013.01)

(58) Field of Classification Search
CPC ........ G06T 2207/20081; G06T 7/0002; G06V 10/75; G06V 10/7515
See application file for complete search history.

(56) References Cited

U.S. PATENT DOCUMENTS

| | | | |
|---|---|---|---|
| 2006/0215901 A1 | 9/2006 | Nakagaki et al. | |
| 2007/0145270 A1* | 6/2007 | Miyamoto | H01J 37/265 250/310 |
| 2010/0128970 A1* | 5/2010 | Nakagaki | G06T 7/001 382/149 |
| 2011/0285839 A1* | 11/2011 | Kotaki | H01J 37/28 348/80 |
| 2018/0157933 A1 | 6/2018 | Brauer et al. | |
| 2018/0240225 A1 | 8/2018 | Harada et al. | |
| 2018/0266968 A1* | 9/2018 | Hirai | G06T 7/001 |
| 2019/0197680 A1* | 6/2019 | Sakai | H01L 22/12 |
| 2019/0287230 A1 | 9/2019 | Lu et al. | |
| 2020/0034957 A1* | 1/2020 | Kondo | H01L 22/12 |
| 2020/0083017 A1* | 3/2020 | Harada | G01N 21/956 |
| 2020/0111217 A1* | 4/2020 | Yokoyama | G06N 3/047 |
| 2021/0133989 A1* | 5/2021 | Bhattacharyya | G06N 20/00 |

FOREIGN PATENT DOCUMENTS

| | | |
|---|---|---|
| JP | 2001-85482 A | 3/2001 |
| JP | 2001-189358 A | 7/2001 |
| JP | 2004-354251 A | 12/2004 |
| JP | 2006-269489 A | 10/2006 |
| JP | 2007-184565 A | 7/2007 |
| JP | 2010-161247 A | 7/2010 |
| JP | 2016-148747 A | 8/2016 |
| JP | 2018-137275 A | 8/2018 |
| JP | 2018-205163 A | 12/2018 |
| WO | 2019/216303 A1 | 11/2019 |

OTHER PUBLICATIONS

International Search Report of PCT/JP2021/000484 dated Mar. 30, 2021.

* cited by examiner

[FIG. 1]
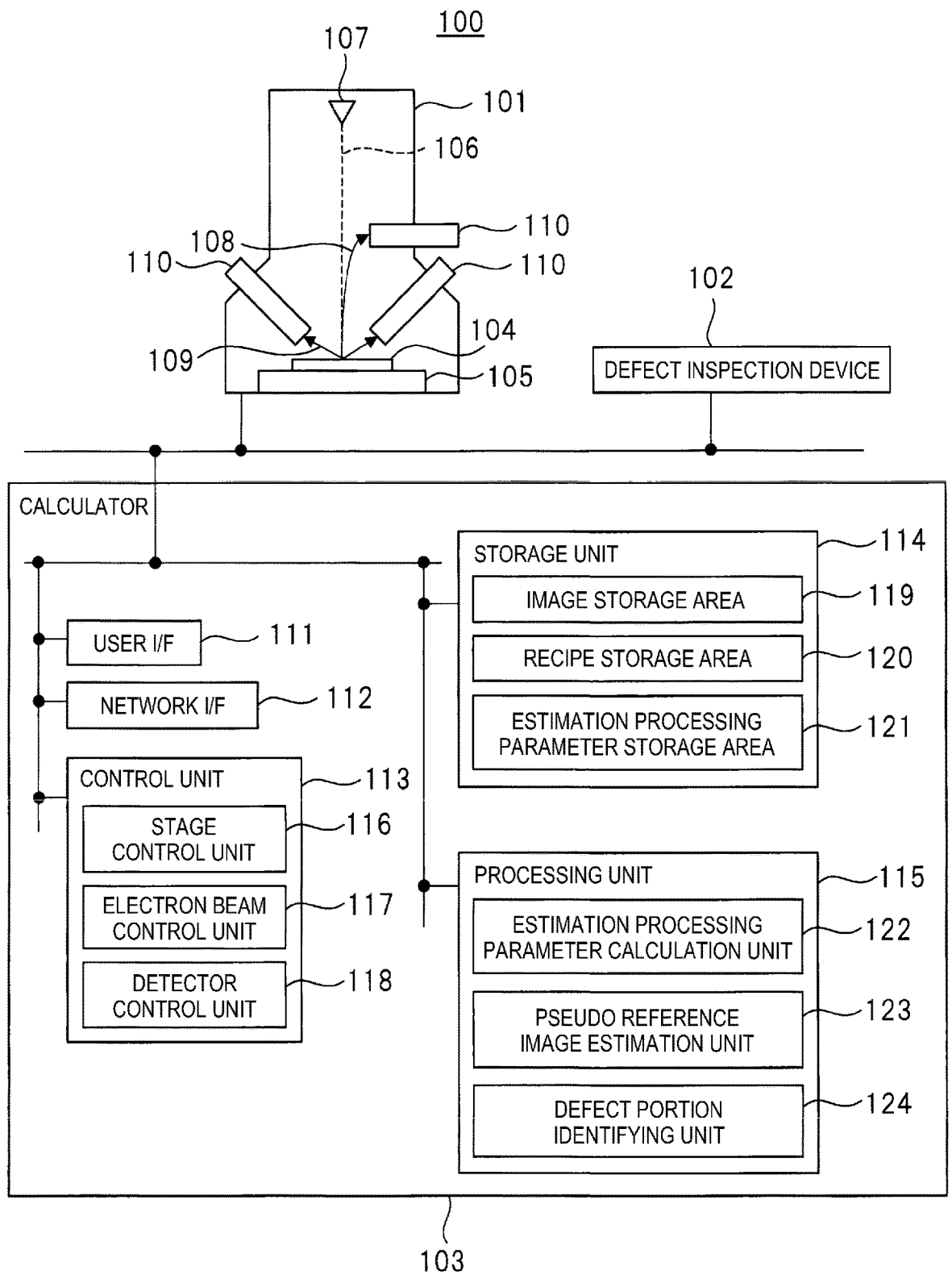

[FIG. 2]
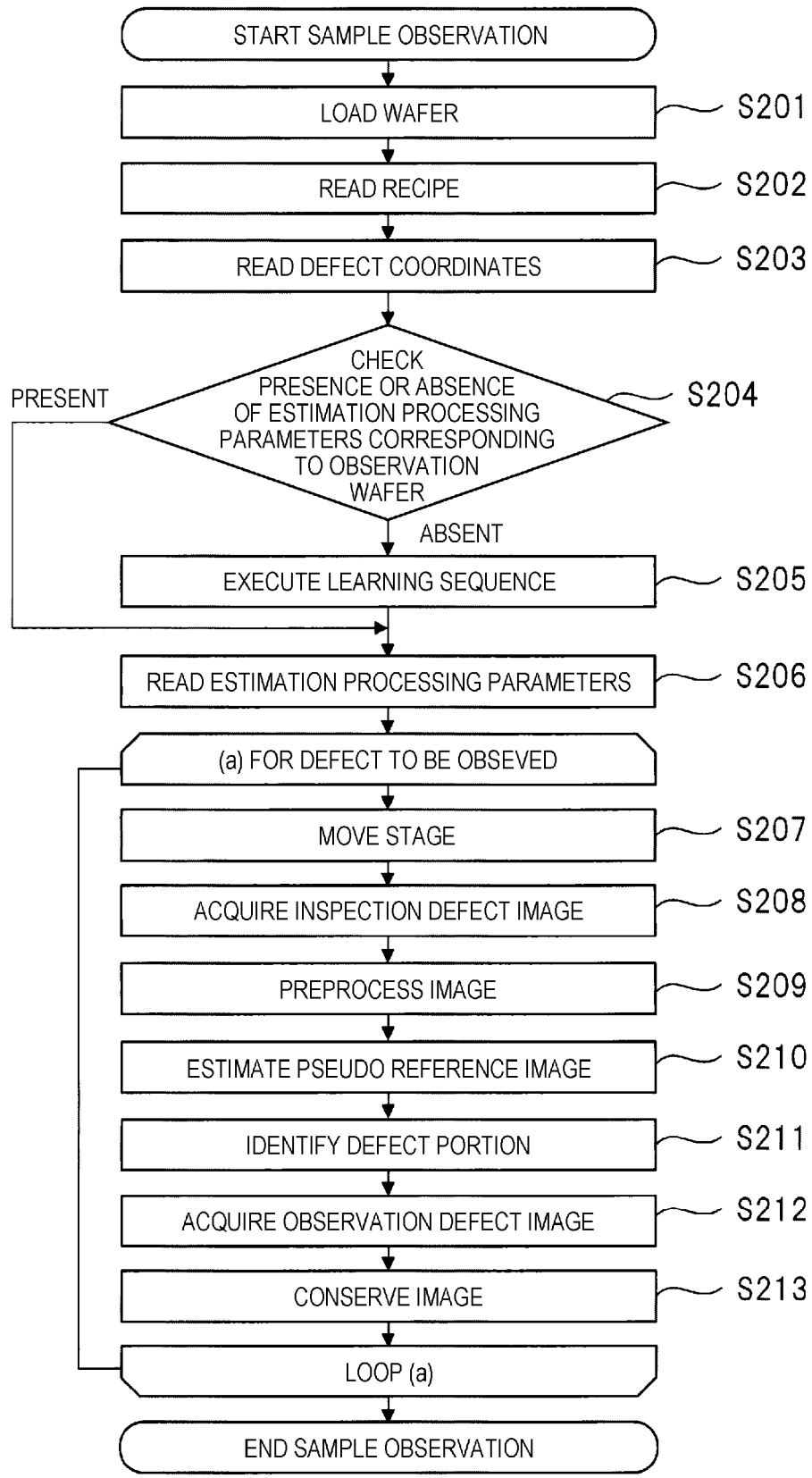

[FIG. 3]
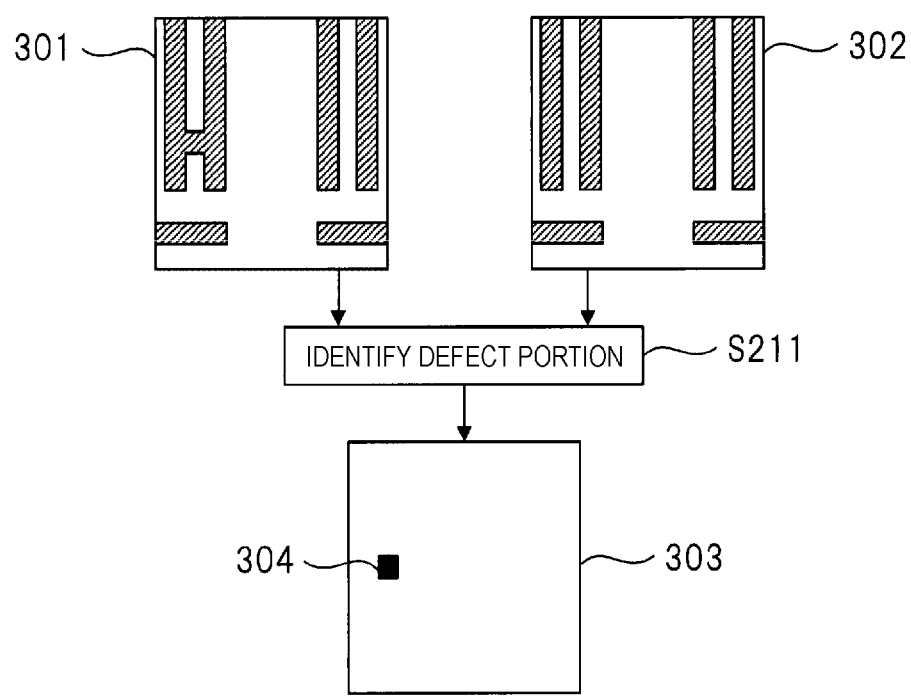

[FIG. 4]
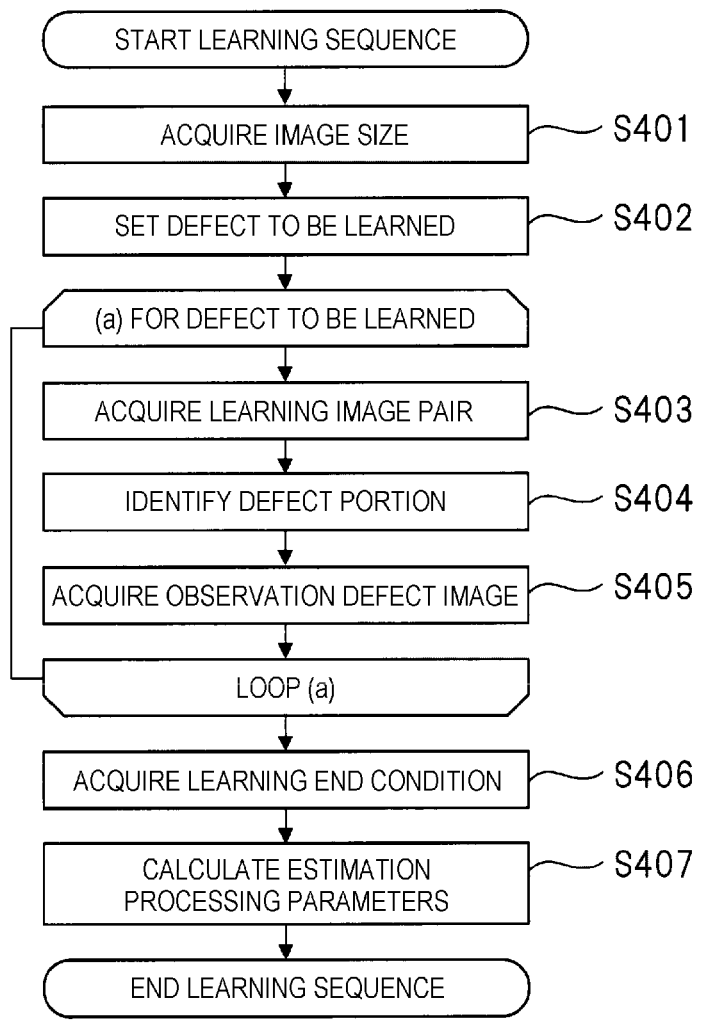

[FIG. 5]
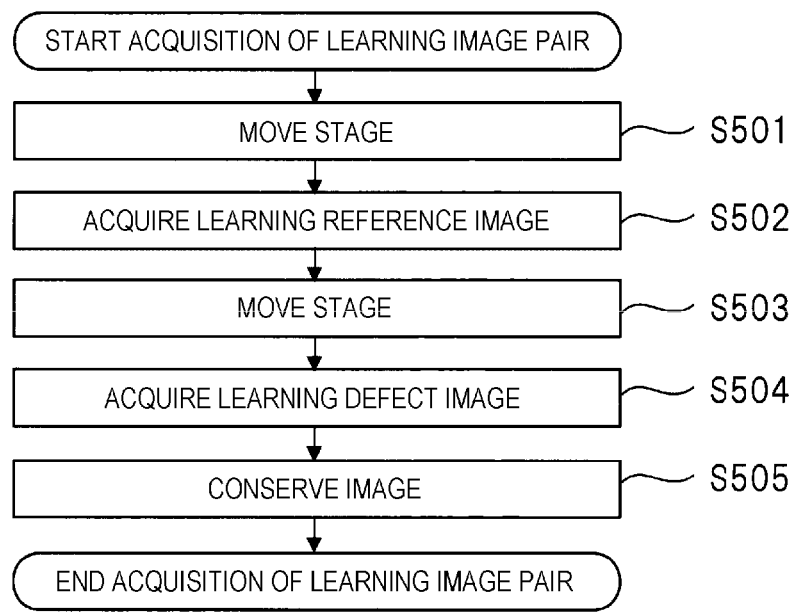

[FIG. 6]
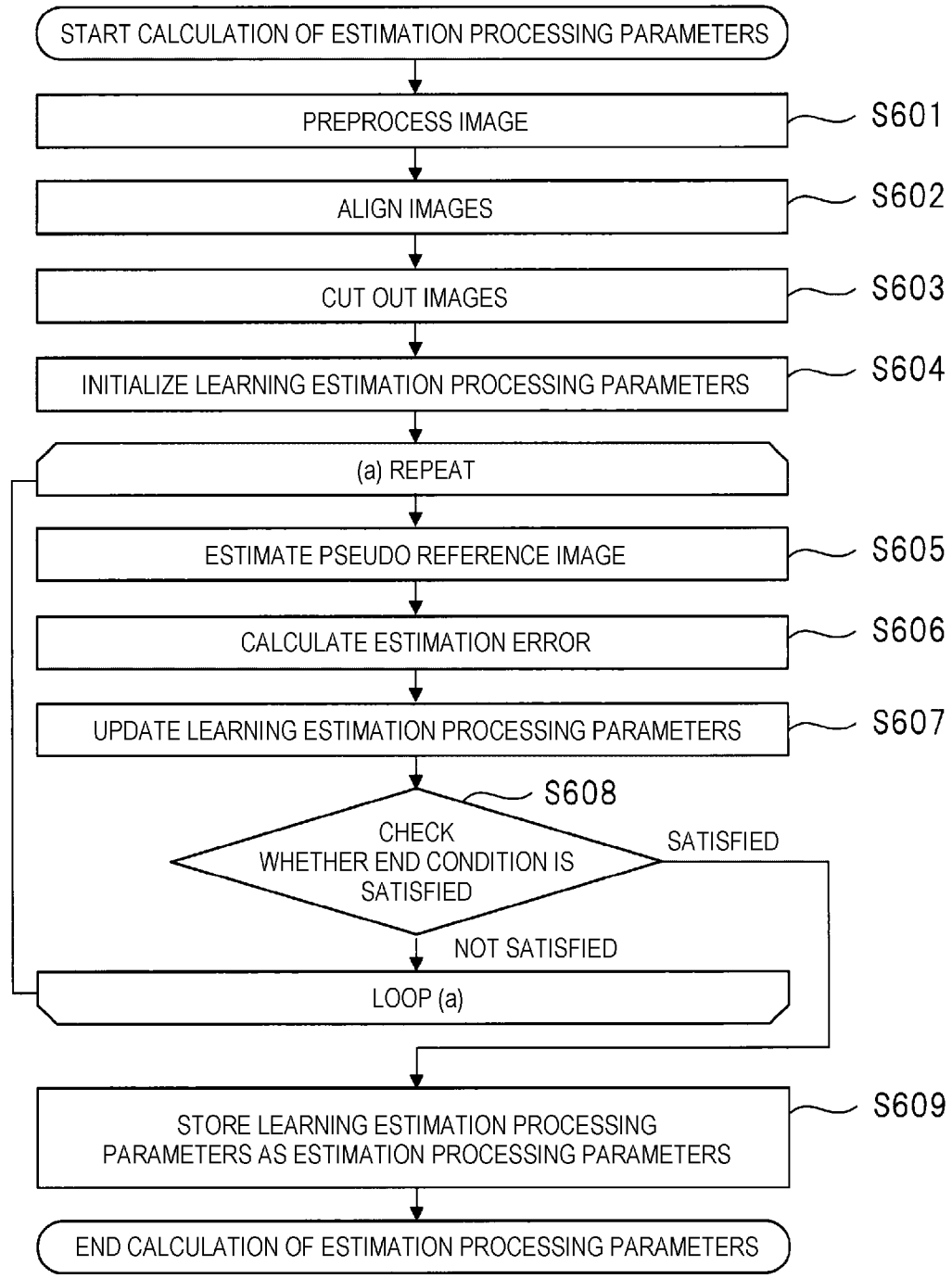

[FIG. 7]
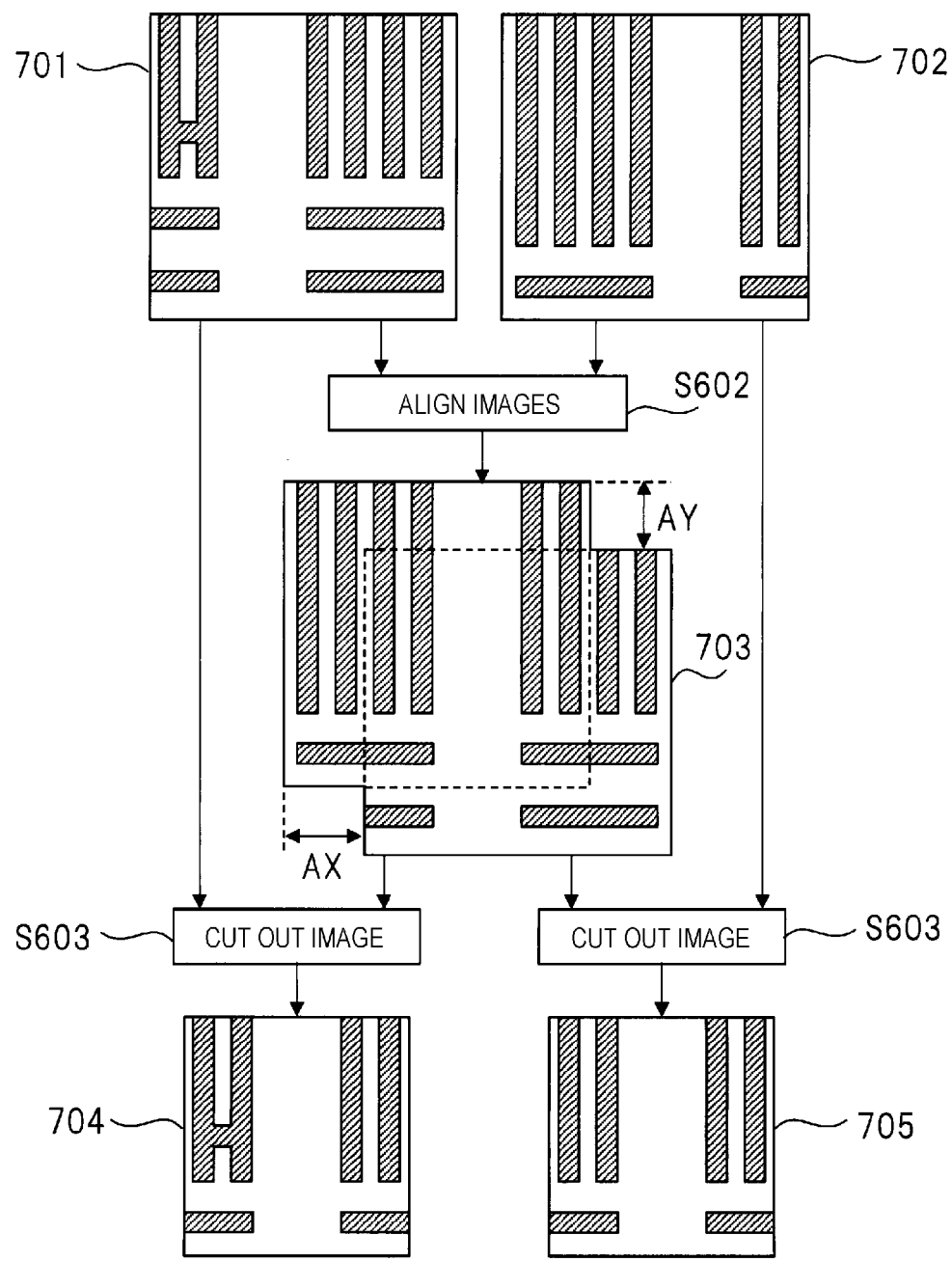

[FIG. 8]
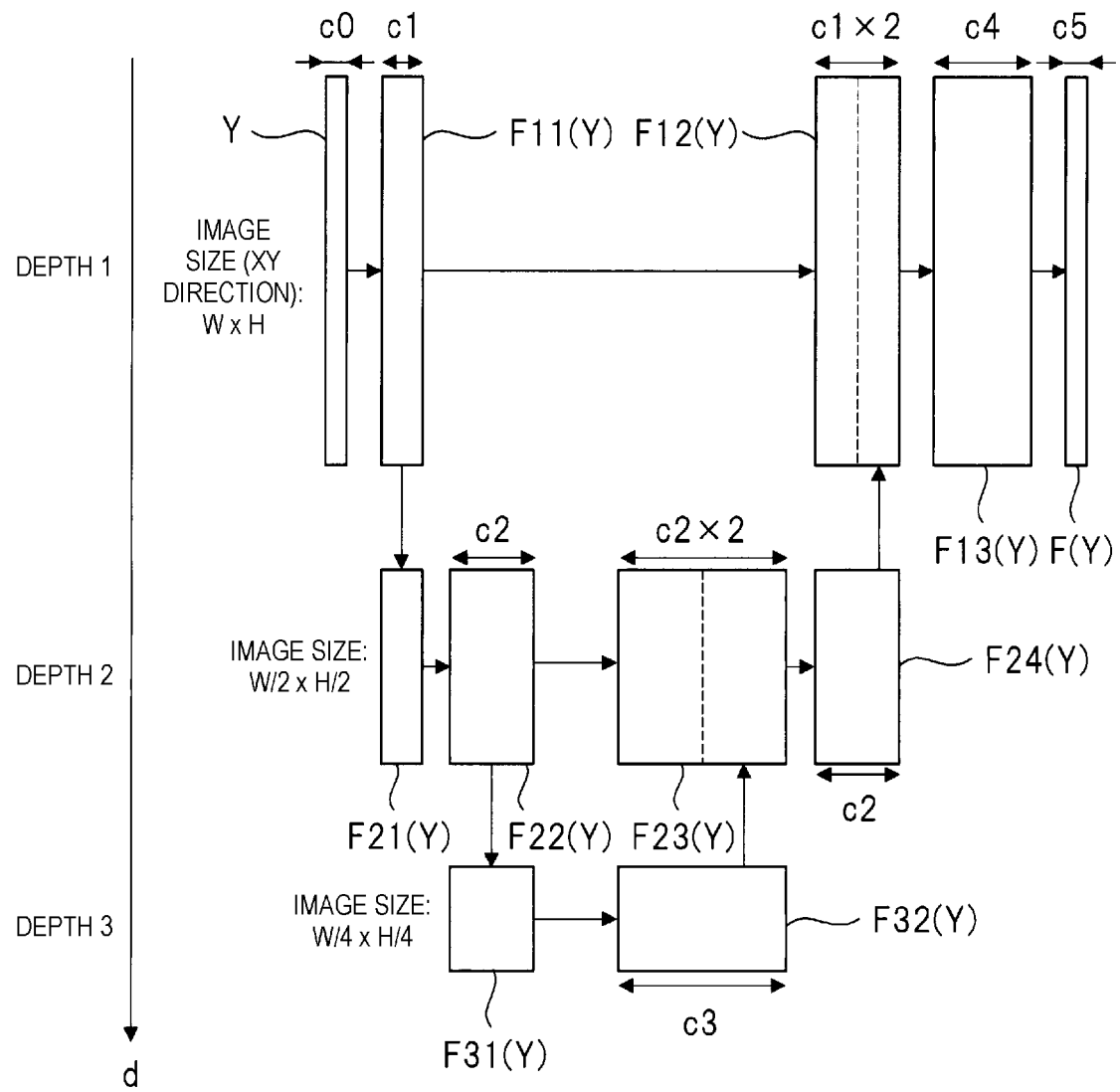

[FIG. 9]
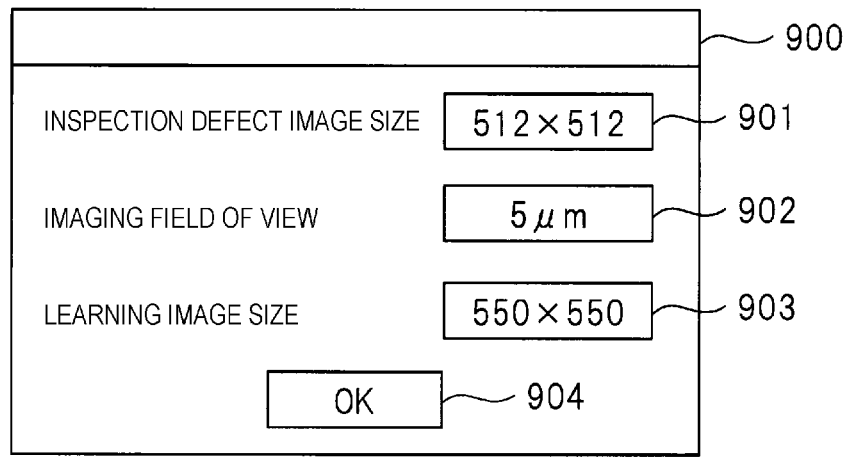
[FIG. 10]
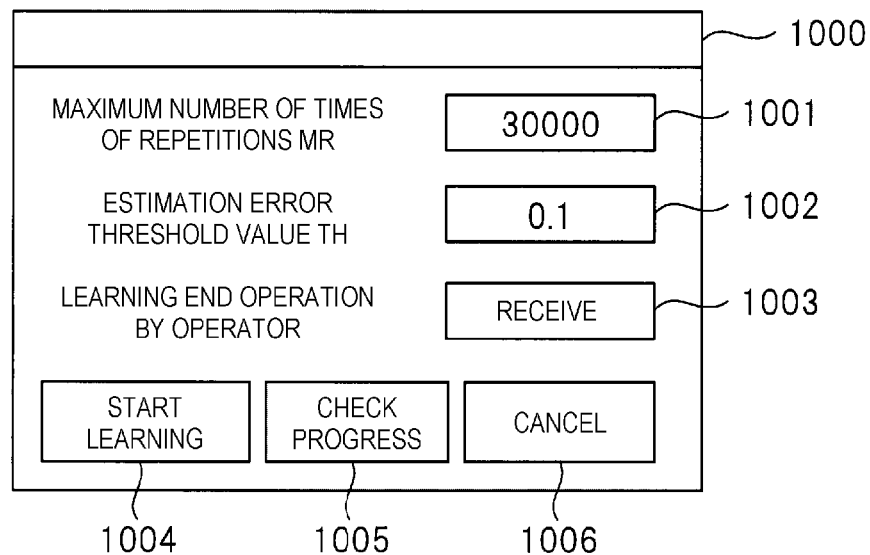

[FIG. 11]
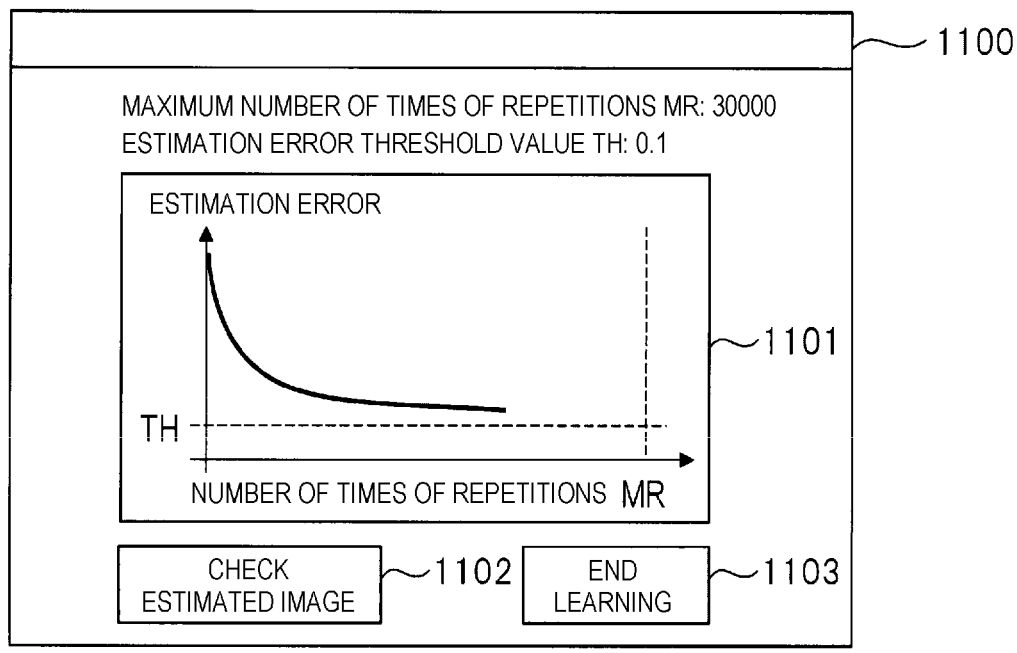
[FIG. 12]
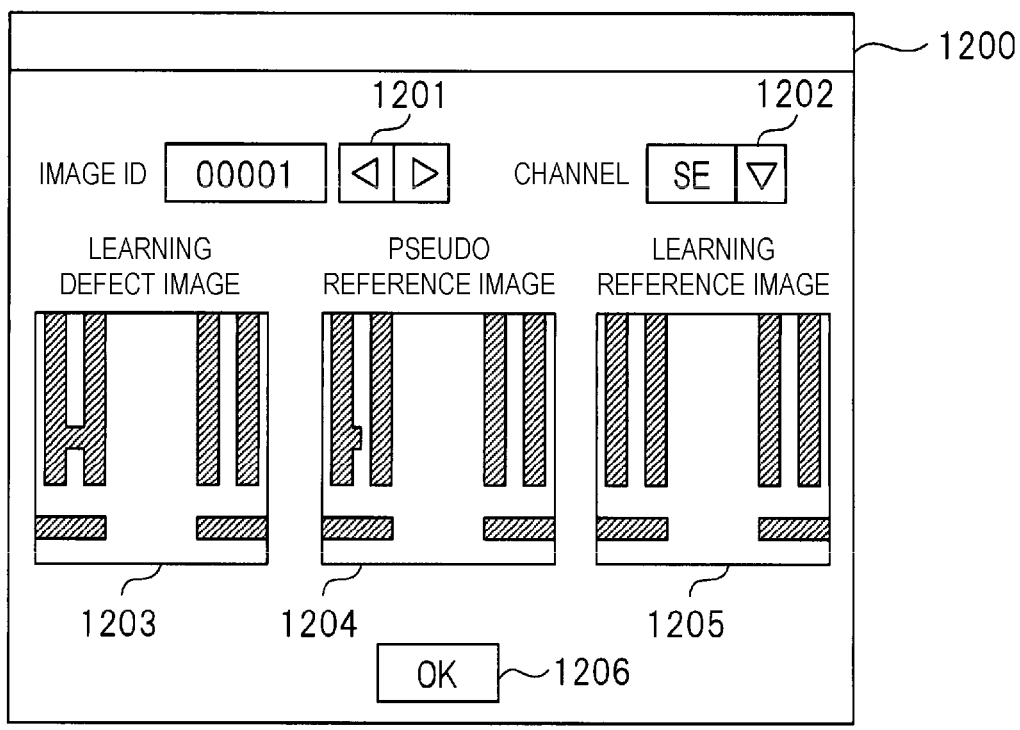

[FIG. 13]
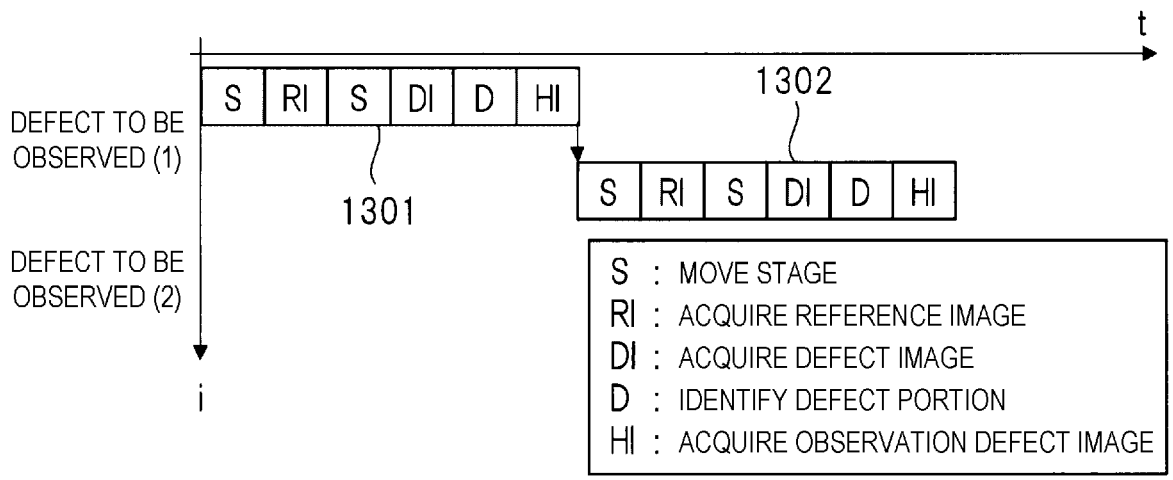
[FIG. 14]
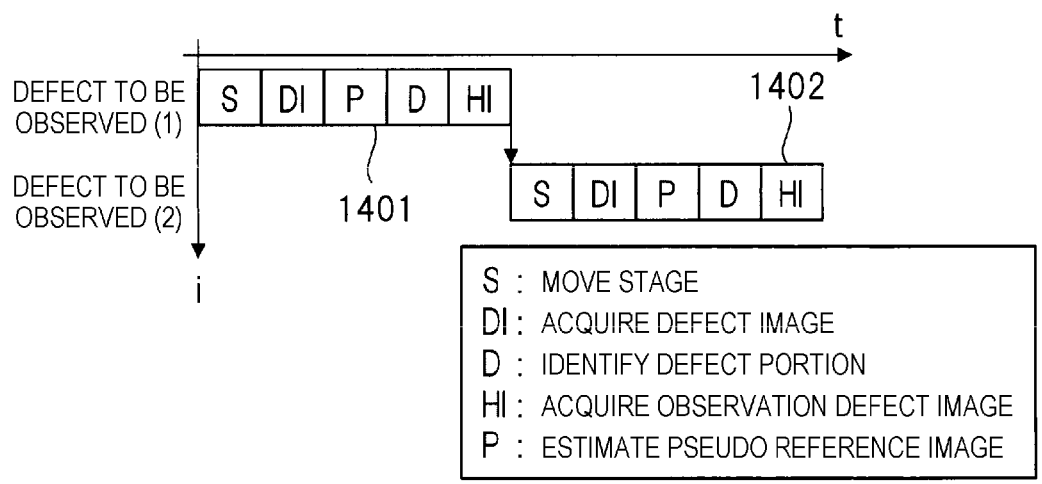

[FIG. 15]
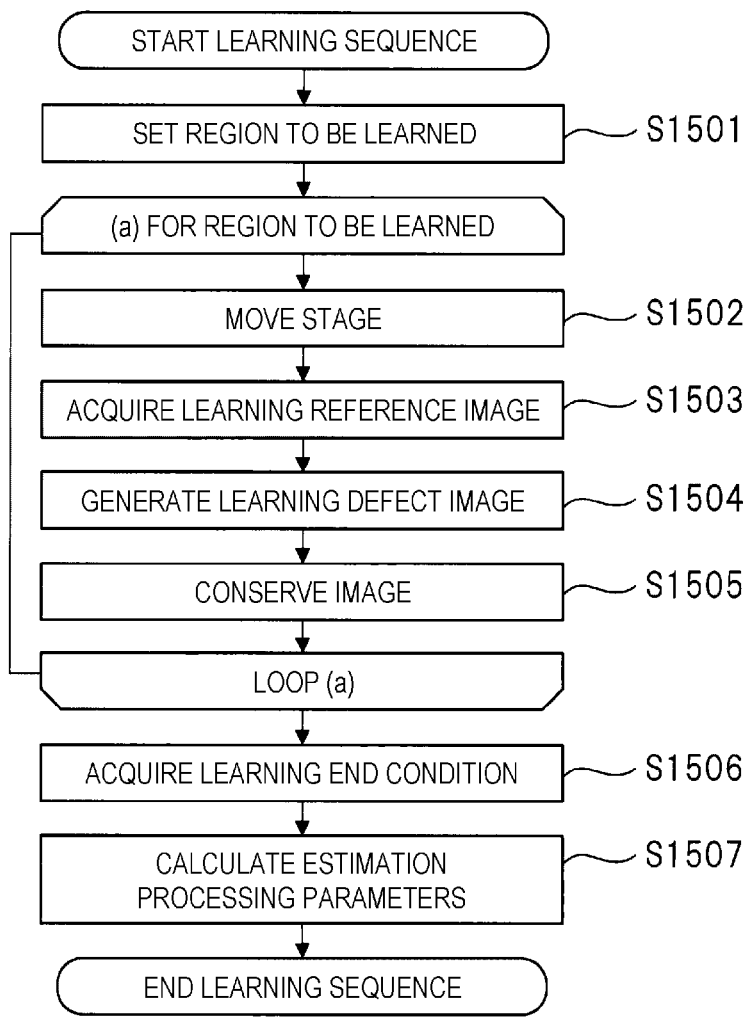

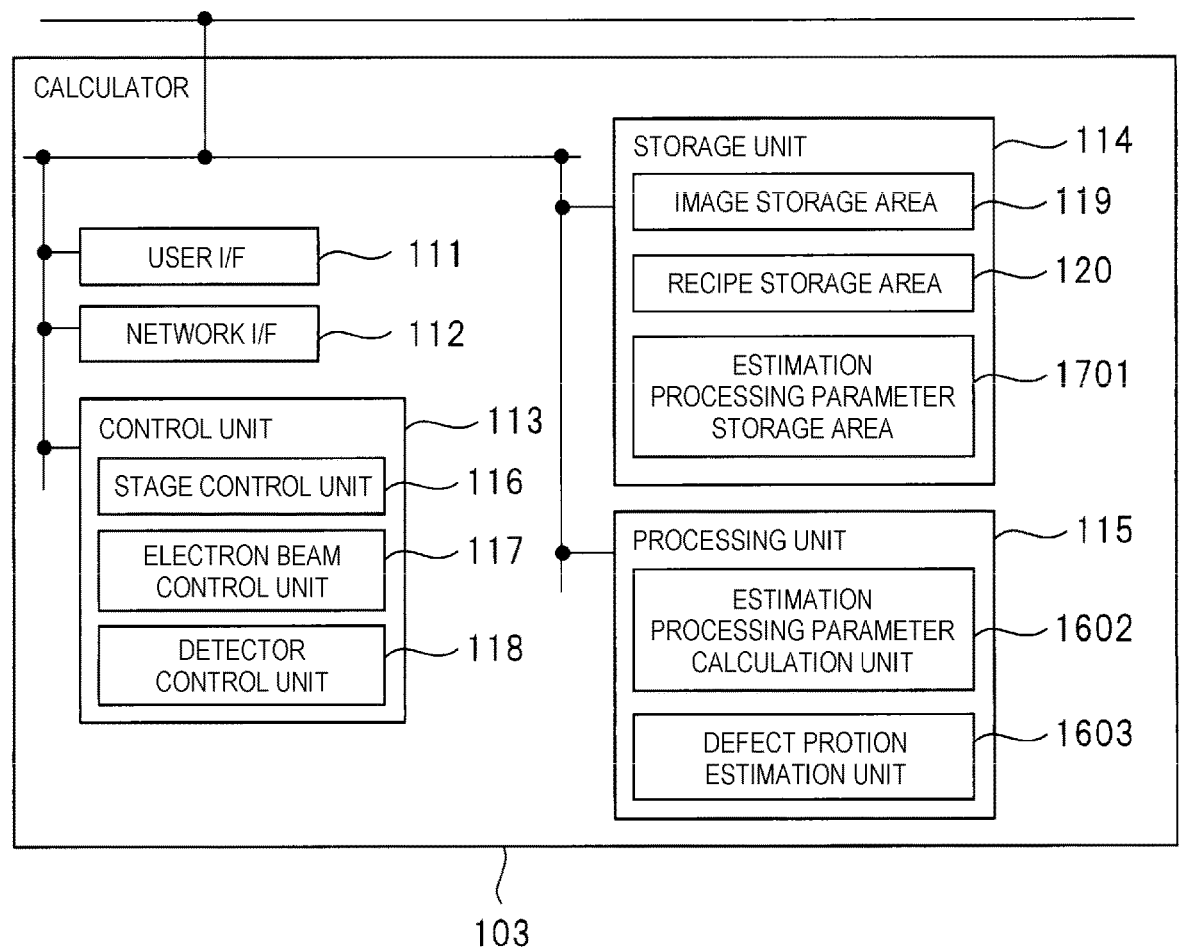
[FIG. 16]

[FIG. 17]
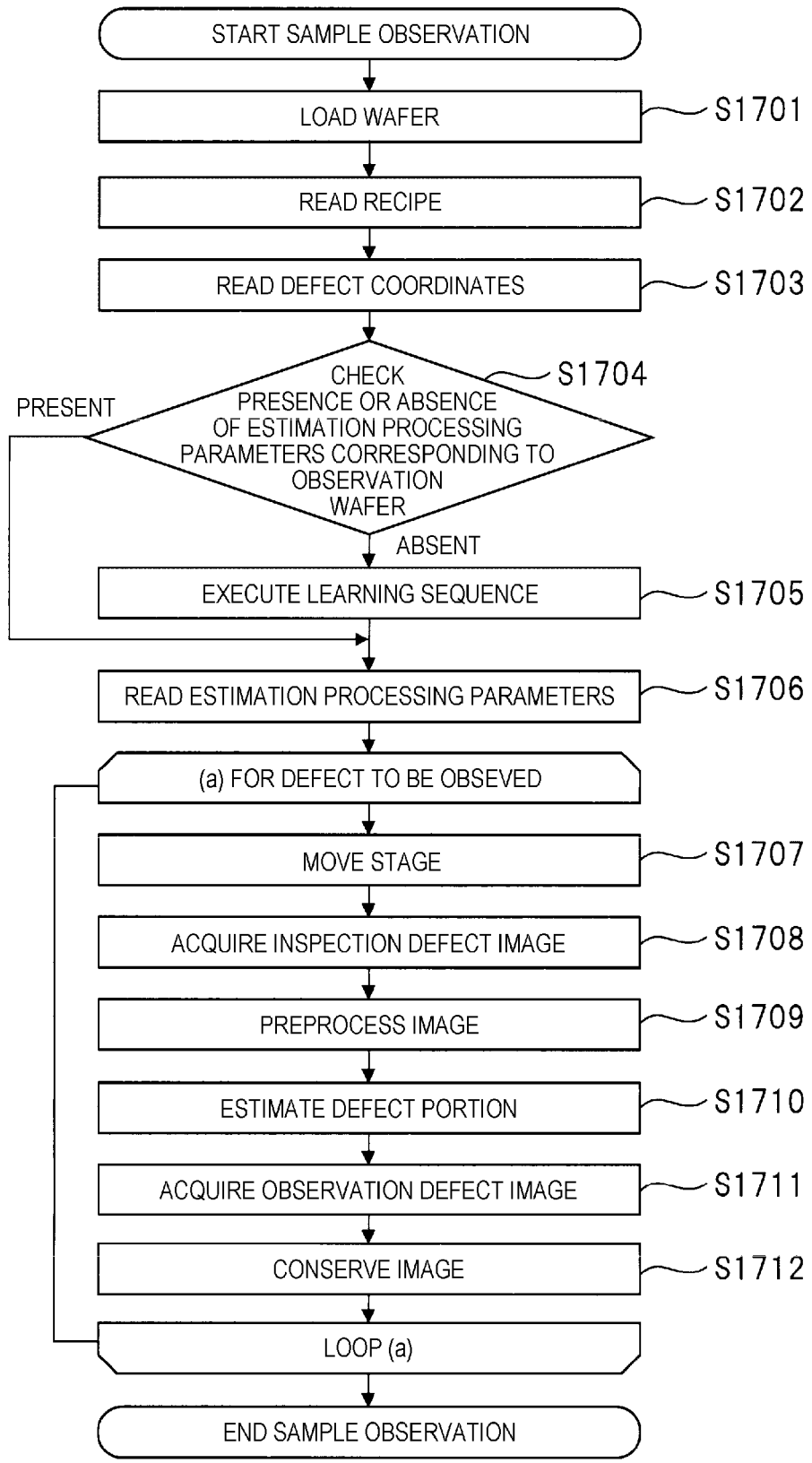

[FIG. 18]
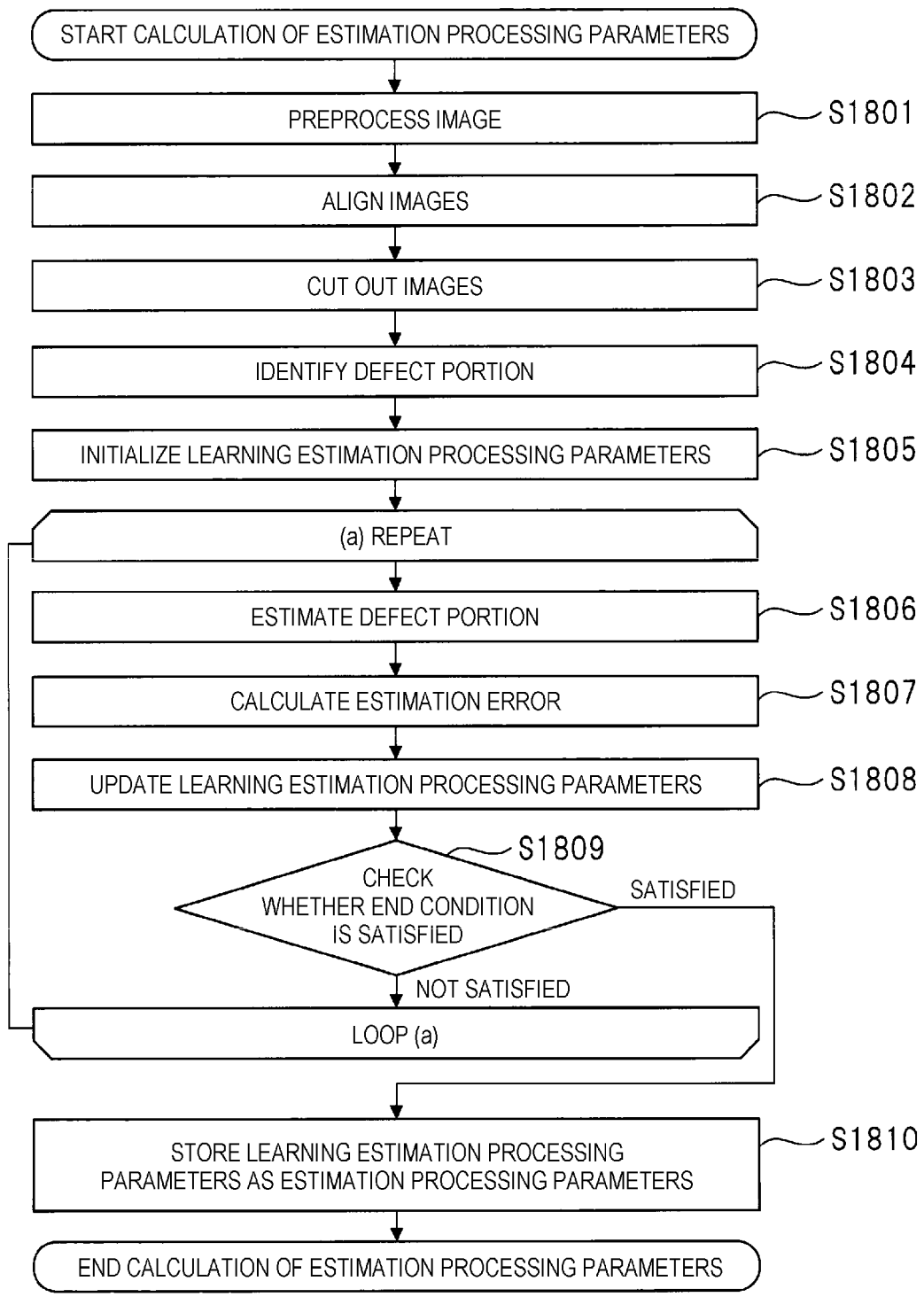

[FIG. 19]
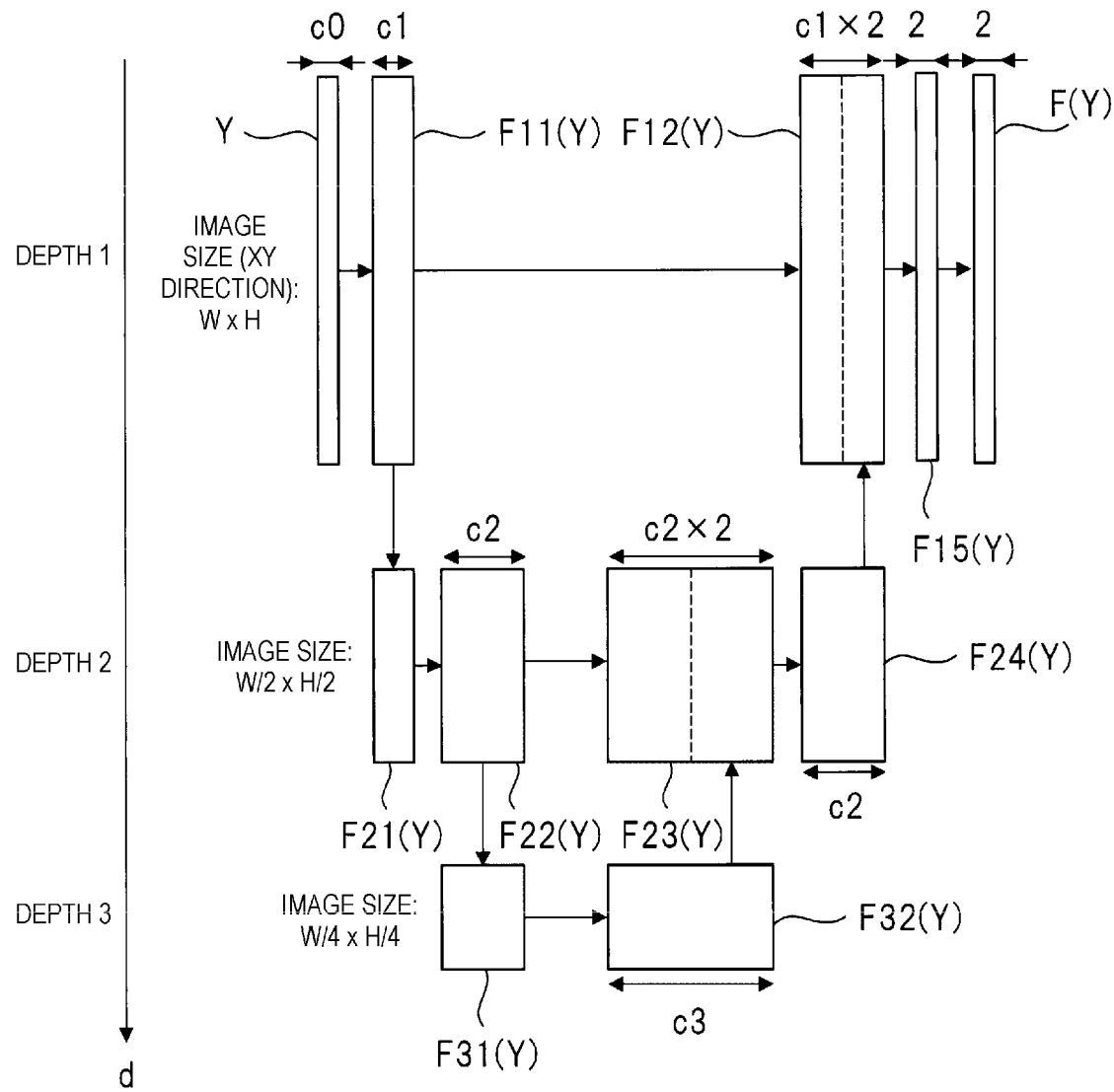

[FIG. 20]

EQUATION 1 :  $F11(Y) = \max(0, W1 * Y + B1)$

EQUATION 2 :  $F21(Y) = DS(F11(Y))$

EQUATION 3 :  $F22(Y) = \max(0, W2 * F21(Y) + B2)$

EQUATION 4 :  $F31(Y) = DS(F22(Y))$

EQUATION 5 :  $F32(Y) = \max(0, W3 * F31(Y) + B3)$

EQUATION 6 :  $F23(Y) = CC(F22(Y), W4 * US(F32(Y)) + B4)$

EQUATION 7 :  $F24(Y) = \max(0, W5 * F23(Y) + B5)$

EQUATION 8 :  $F12(Y) = CC(F11(Y), W6 * US(F24(Y)) + B6)$

EQUATION 9 :  $F13(Y) = \max(0, W7 * F12(Y) + B7)$

EQUATION 10 :  $F(Y) = W8 * F13(Y) + B8$

[FIG. 21]

EQUATION 11 :  $F15(Y) = \max(0, W9 * F12(Y) + B9)$

EQUATION 12 :  $F(Y)(x,y,c) = \dfrac{\exp(F15(Y)(x,y,c))}{\sum_{i=1,2} \exp(F15(Y)(x,y,i))}$ EQUATION 13 :  $MSK(x,y,c) = \begin{cases} 1 & (\text{if } DD(x,y) = c) \\ 0 & (\text{else}) \end{cases}$

SAMPLE OBSERVATION SYSTEM AND IMAGE PROCESSING METHOD

TECHNICAL FIELD

The present invention relates to a sample observation system and an image processing method for observing a circuit pattern or a defect formed on a semiconductor wafer as a sample using a charged particle microscope or the like.

BACKGROUND ART

In manufacture of semiconductor wafers, it is important to quickly start up a manufacturing process and early shift to a mass production system with a high yield in order to ensure profits. For this purpose, various inspection devices, devices for observing defects on a sample, and measurement devices are introduced into a manufacturing line.

The device for observing defects on a sample is a device for capturing an image of a defect position on a wafer at a high resolution based on defect position coordinates (coordinate information indicating a position of a defect on a sample (wafer)) output from a defect inspection device and outputting the image, and a defect observation device (hereinafter, referred to as a review SEM) using a scanning electron microscope (SEM) is widely used.

In a mass production line of semiconductors, automation of a sample observation operation is desired, and the review SEM has a function of performing an automatic defect image collection process (ADR: Automated Defect Review) of automatically collecting images at defect positions in a sample and a function of performing an automatic defect image classification process (ADC: Automated Defect Classification) of automatically classifying the collected defect images.

Since the defect position coordinates output by the defect inspection device include an error, the ADR has a function of obtaining an observation image by re-detecting a defect from an image captured with a wider field of view around the defect position coordinates output by the defect inspection device and imaging a position of the re-detected defect at a high magnification. As a method for detecting a defect from an SEM image, JP-A-2001-189358 (PTL 1) discloses a method for detecting a defect by comparing an image obtained by imaging a defect portion (hereinafter, referred to as a defect image) with a reference image using an image obtained by imaging a region in which a circuit pattern same as that of the defect portion is formed as the reference image.

WO2019/216303 (PTL 2) discloses a method for detecting a defect candidate by generating a reference image based on a database image corresponding to design data and a captured image, and comparing the captured image with the reference image.

Non-PTL 1 discloses a method for learning a correspondence relationship between an input image and an output image using a neural network.

CITATION LIST

Patent Literature

PTL 1: JP-A-2001-189358
PTL 2: WO2019/216303

Non Patent Literature

Non-PTL 1: Olaf Ronneberger, Philipp Fischer, Thomas Brox, "U-Net: Convolutional Networks for Biomedical ImageSegmentation", arXiv preprint arXiv: 1505.04597 (2015)

SUMMARY OF INVENTION

Technical Problem

A system for observing a defect on a sample according to the invention (hereinafter, referred to as a sample observation system) relates to a system for imaging a sample such as a semiconductor wafer, acquiring an image, and observing the image.

In the sample observation system, it is important to acquire a larger number of images per unit time (to operate with high throughput). PTL 1 discloses the method for acquiring the reference image for each defect image and performing defect detection. However, if the reference image can be estimated from the defect image, the acquisition of the reference image can be omitted, and thus the throughput of a sample observation can be improved. PTL 2 discloses the method for generating the reference image based on the database image corresponding to the design data and the captured image. However, the design data is highly confidential information, and is not allowed to be taken out to a semiconductor manufacturing line, in particular, a mass production line in which high throughput is required, and it may be difficult to use the design data. As described above, when the design data cannot be used, it is difficult to estimate the reference image based on the defect image, and any of the above-described known examples does not refer to a method for solving this problem.

An object of the invention is to solve the above-described problems in the related art, and to make it possible to estimate a reference image based on a defect image without using design data and to improve the throughput of a sample observation.

Another object of the invention is to solve the above-described problems in the related art, and to make it possible to estimate the defect portion from the defect image without using the design data and to improve the throughput of the sample observation.

Solution to Problem

A sample observation system including a scanning electron microscope and a calculator, and a method, or the calculator provided in the sample observation system according to the invention: (1) acquires a plurality of images captured by the scanning electron microscope; (2) acquires, from the plurality of images, a learning defect image including a defect portion and a learning reference image not including the defect portion; (3) calculates an estimation processing parameter using the learning defect image and the learning reference image; (4) acquires an inspection defect image including a defect portion; and (5) estimates a pseudo reference image by using the estimation processing parameter and the inspection defect image.

From another point of view, a sample observation system including a scanning electron microscope and a calculator, and a method, or the calculator provided in the sample observation system according to the invention: acquires a plurality of images captured by the scanning electron microscope; acquires, from the plurality of images, a learning defect image including a defect portion; calculates an estimation processing parameter using the learning defect image; acquires an inspection defect image including a defect portion; and estimates the defect portion in the inspection defect image by using the estimation processing parameter and the inspection defect image.

Advantageous Effects of Invention

According to the invention, it is possible to estimate a reference image based on a defect image even when design data cannot be used in a sample observation. Further, by estimating a reference image, it is possible to omit acquisition of the reference image, and it is possible to improve throughput of the sample observation.

In addition, according to the invention, it is possible to estimate a defect portion from a defect image in the sample observation. Further, by estimating the defect portion from the defect image, it is possible to omit the acquisition of the reference image, and it is possible to improve the throughput of the sample observation.

BRIEF DESCRIPTION OF DRAWINGS

FIG. 1 is a block diagram showing a schematic configuration of a sample observation system according to a first embodiment.

FIG. 2 is a flowchart showing a flow of sample observation in the sample observation system according to the first embodiment.

FIG. 3 is a diagram showing an example of a result of identifying a defect portion in the sample observation of the sample observation system according to the first embodiment.

FIG. 4 is a flowchart showing a flow of a learning sequence of the sample observation system according to the first embodiment.

FIG. 5 is a flowchart of a process of acquiring a learning image pair in the learning sequence of the sample observation system according to the first embodiment.

FIG. 6 is a flowchart of a process of calculating an estimation processing parameter in the learning sequence of the sample observation system according to the first embodiment.

FIG. 7 is a diagram showing a process of aligning an image pair and a process of cutting out an image in the calculation of the estimation processing parameter of the sample observation system according to the first embodiment.

FIG. 8 is a block diagram showing a configuration of a neural network for estimating a pseudo reference image in the sample observation system according to the first embodiment.

FIG. 9 is a GUI for setting a learning image size in the sample observation system according to the first embodiment.

FIG. 10 is a GUI for setting a learning end condition in the sample observation system according to the first embodiment.

FIG. 11 is a GUI for confirming an estimation error for each learning step in the sample observation system according to the first embodiment.

FIG. 12 is a GUI for displaying a designated image among the pseudo reference images estimated based on a learning defect image in the sample observation system according to the first embodiment.

FIG. 13 is a timing chart of a process of acquiring an observation defect image by a sample observation system of related art to be compared with the sample observation system according to the first embodiment.

FIG. 14 is a timing chart of a process of acquiring an observation defect image by the sample observation system according to the first embodiment.

FIG. 15 is a flowchart showing a flow of a learning sequence of the sample observation system according to a second embodiment.

FIG. 16 is a block diagram showing a schematic configuration of a calculator in a sample observation system according to a third embodiment.

FIG. 17 is a flowchart showing a flow of sample observation in the sample observation system according to the third embodiment.

FIG. 18 is a flowchart of a process of calculating an estimation processing parameter in the learning sequence of the sample observation system according to the third embodiment.

FIG. 19 is a block diagram showing a configuration of a neural network for estimating a defect portion in the sample observation system according to the third embodiment.

FIG. 20 is a diagram showing equations used when the pseudo reference image is estimated based on partial learning defect images according to the first to third embodiments.

FIG. 21 is a diagram showing equations used in the process of the third embodiment.

DESCRIPTION OF EMBODIMENTS

Embodiments will be described with reference to the drawings. The embodiments described below do not limit the invention according to the claims, and all of the elements and combinations thereof described in the embodiments are not necessarily essential to the solution of the invention.

First Embodiment

<System Configuration>

A sample observation system according to the present embodiment will be described with reference to FIG. 1. In the present embodiment, a sample observation system including a scanning electron microscope (SEM) will be described as an imaging apparatus for imaging a sample. However, the imaging apparatus according to the present embodiment may be an imaging apparatus other than the SEM, and may be an optical microscope or an imaging apparatus using charged particles such as ions. In addition, although an image obtained by imaging a defect on a semiconductor wafer will be described as an image to be observed, the image may be an image obtained by imaging another sample such as a flat panel display or a biological sample.

FIG. 1 shows a configuration of a sample observation apparatus 100 according to the present embodiment. The sample observation apparatus (also referred to as a sample observation system) 100 includes an SEM 101 that images a sample, a defect inspection device 102 that detects a defect of the sample, and a calculator 103.

The SEM 101 includes a stage 105 on which a sample wafer 104 to be observed is placed and which is movable on an X-Y plane or in an X-Y-Z space, an electron source 107 which generates an electron beam 106 with which the sample wafer 104 is irradiated, a detector 110 which detects a secondary electron 108, a backscattered electron 109, and the like generated from the sample wafer 104 irradiated with the electron beam 106, an electron lens (not shown) which converges the electron beam 106 on the sample wafer 104, and a deflector (not shown) for scanning the sample wafer 104 with the electron beam 106.

The defect inspection device 102 is a device that captures an optical image of a wafer surface and inspects a defect by comparing the optical image with an image of a non-defective portion (for example, an image of an adjacent chip). However, such an inspection device is affected by an illumination wavelength thereof, and a resolution limit of the acquired image is about several hundreds of nanometers. Therefore, regarding a defect an order of several tens of nanometers on the wafer, only a presence or absence of the defect can be detected, and defect coordinates on the wafer are output.

The calculator 103 includes a user interface (denoted as a user I/F in the drawing) 111, a network interface (denoted as a network I/F in the drawing) 112, a control unit 113 that controls the SEM 101, a storage unit 114 that stores information, and a processing unit 115. Examples of the storage unit 114 include a magnetic disk device, and a volatile or nonvolatile semiconductor memory device, and the storage unit 114 may be another storage device. The storage unit may include a plurality of the above-described devices. In addition, an example of the processing unit may be any one of a CPU, a GPU, an FPGA, and an LSI, or may be implemented by a combination thereof. The control unit 113 described later may be a subsystem (also referred to as a control subsystem) different from the calculator 103. In the present specification, one calculator 103 is described as the example, but a plurality of calculators may be used. For example, it is conceivable that processing for GUI display is performed by a calculator for display such as a tablet and a smartphone, and other image processing is performed by another calculator. In addition, the calculator may include a plurality of the above-described components. The user interface 111 is a touch panel, a display, a keyboard, a mouse, or the like, and may be another device as long as the device can receive an operation from an operator (user) and display information. The network interface 112 is an interface for communicating with an external device such as the defect inspection device or the SEM via a network.

Configurations of the control unit 113, the processing unit 115, and the storage unit 114 according to the present embodiment will be described.

The control unit 113 includes a stage control unit 116, an electron beam control unit 117, and a detector control unit 118. The stage control unit 116 controls movement, stop, and the like of the stage 105. The electron beam control unit 117 controls the deflector (not shown) so that the irradiation with the electron beam 106 is within a predetermined field of view, and controls a scan region of the electron beam 106 on the sample wafer 104. The detector control unit 118 samples a signal from the detector 110 in synchronization with scanning of the electron beam 106 driven by the deflector (not shown), adjusts a gain, an offset, and the like, and generates a digital image. The control unit 113 may be implemented by, for example, a circuit, or may be implemented by the CPU, the GPU, the FPGA, or the LSI.

The storage unit 114 includes an image storage area 119 for storing the digital image generated by the detector control unit 118 together with accessory information, a recipe storage area 120 for storing a recipe including information on a device or a manufacturing process, imaging conditions of an image, and the like, and an estimation processing parameter storage area 121 for storing parameters related to an estimation process of a pseudo reference image. Note that each area does not necessarily have to be a divided area. A data arrangement in the storage unit 114 may be in any format as long as the recipe, the parameters, and estimation processing parameters can be stored.

The processing unit 115 includes an estimation processing parameter calculation unit 122 that calculates the estimation processing parameters for estimating the pseudo reference image based on a defect image, a pseudo reference image estimation unit 123 that estimates the pseudo reference image based on the estimation processing parameters, and a defect portion identifying unit 124 that identifies a defect portion in the defect image. When the processing unit 115 is a device, such as the CPU or the GPU, that executes a predetermined process by a program, programs (collectively referred to as image processing programs) corresponding to the estimation processing parameter calculation unit 122, the pseudo reference image estimation unit 123, and the defect portion identifying unit 124 are stored in the storage unit 114. Then, the processing unit 115 reads the programs to implement these processes.

Next, a process performed in the present embodiment will be described. Unless otherwise specified, the following processes related to the first to third embodiments are performed by the calculator 103. More specifically, the control of the SEM 101 is a process performed by the control unit 113, and other processes are performed by the processing unit 115, which is an example of division of the processes. When the processing unit 115 is the CPU or the GPU, the processing unit 115 reads and implements the program (hereinafter, may be referred to as the image processing program) stored in the storage unit 114. However, even in a case where the processes performed by the estimation processing parameter calculation unit 122, the pseudo reference image estimation unit 123, or the defect portion identifying unit 124 are described, these units are included in the processing unit 115, and thus it may be considered that the processes are processed by the processing unit 115.

<Sample Observation>

An observation process of a sample will be described with reference to FIG. 2.

First, the process waits until the sample wafer 104 to be observed is loaded onto the stage 105 (S201). Next, a recipe corresponding to the sample wafer to be observed is read from the recipe storage area (S202). A semiconductor pattern formed on the sample wafer 104 is manufactured through a large number of manufacturing processes, and an appearance may be greatly different in each process. Further, characteristics of the sample, such as ease of charging, may be different. Therefore, it is common to adjust and store imaging conditions for each device or each manufacturing process. For the same reason, estimation accuracy is improved by managing the estimation processing parameters of the pseudo reference image for each process.

Next, information on the defect coordinates output from the defect inspection device 102 is received or read (S203). Here, all of the received or read defect coordinates may be set to be observed, or the defect coordinates sampled based on user designation conditions may be set to be observed. Next, it is checked whether the estimation processing parameters corresponding to a process in which the sample wafer 104 is processed is stored in the estimation processing parameter storage area 121 (S204), and when the estimation processing parameters are not stored ("ABSENT" in FIG. 2), the estimation processing parameters are calculated by a learning sequence described later, and a result is stored in the estimation processing parameter storage area 121 (S205). The information on the defect coordinates may be received from the defect inspection device described above via the network interface 112 or may be read from a portable storage medium such as a USB memory. Note that S205 may be implemented by the estimation processing parameter calculation unit 122, or may be implemented by the entire calculation unit 115 as described above.

Next, the estimation processing parameters of the pseudo reference image are read from the estimation processing parameter storage area 121 (S206). Next, defects to be observed on the sample wafer 104 are sequentially imaged using the SEM 101, and the following series of observations from S207 to S213 are performed.

First, through the control unit 113, the stage 105 is controlled and moved, so that the defects to be observed on the sample wafer 104 are included in an imaging field of view of the SEM 101 (S207). Next, an inspection defect image is acquired (S208). The acquisition of the image is performed, for example, by the SEM 101 irradiating and scanning a relatively wide region including the defects to be observed on the sample wafer 104 with the electron beam 106, imaging the relatively wide region including the defects to be observed by the detector 110 detecting the generated secondary electrons 108 and backscattered electrons 109, the detector control unit 118 processing a detection signal from the detector 110 obtained by the imaging, and acquiring a low-magnification image of the relatively wide region including the defects to be observed.

Next, image preprocessing such as noise removal and luminance non-uniformity correction is applied to the inspection defect image (S209), and the pseudo reference image estimation unit 123 estimates the pseudo reference image based on the inspection defect image subjected to the image preprocessing by using the estimation processing parameters read from the estimation processing parameter storage area 121 (S210). This pseudo reference image corresponds to an image in which a circuit pattern same as that of the inspection defect image is observed and which does not include the defects. In the estimation of the pseudo reference image, design data is not necessary, and the estimation processing parameters and the inspection defect image subjected to the image preprocessing are used.

Next, the defect portion identifying unit 124 compares the inspection defect image with the pseudo reference image, and identifies a defect portion from the inspection defect image (S211). As a method for specifying a defect portion, a method described in PTL 1 or the like may be used.

Next, the specified defect portion is imaged at a large magnification by narrowing the field of view, a defect image for observation (hereinafter referred to as an observation defect image) is acquired (S212), and the inspection defect image, the pseudo reference image, and the observation defect image are stored in the image storage area 119 (S213).

This is the end of the flow in FIG. 2. The series of processes may be repeatedly executed on all the defects to be observed of the sample wafer 104, or may be performed on a part of the defects to be observed based on other criteria. Note that S205 may be managed by the estimation processing parameter calculation unit 122, or may be managed by the entire processing unit 115.

<<Example of Result of Identifying Defect Portion>>

An example of a result of identifying the defect portion in S211 will be described with reference to FIG. 3. When a defect portion is identified using an inspection defect image 301 and a pseudo reference image 302, an identified defect portion image 303 in which the defect portion and a region other than the defect portion can be distinguished from each other is obtained. In the identified defect portion image 303, for example, a pixel value of the defect portion may be set to 1, and a pixel value of the region other than the defect portion may be set to 0.

<<Learning Sequence>>

The process in S205 of calculating the estimation processing parameters by the learning sequence and storing the result in the estimation processing parameter storage area 121 will be described with reference to FIG. 4.

First, a size of an image to be acquired for learning is acquired (S401). Next, a defect to be learned is set (S402). Here, all the defect coordinates read in S203 may be set to be learned, or the defect coordinates sampled based on the user designation conditions may be set to be learned. Next, a pair of an image including the defect which is set to be learned (hereinafter, referred to as a learning defect image) and an image including a region designed to form a circuit pattern same as that around a position of the defect to be learned (hereinafter, referred to as a learning reference image) are acquired (S403).

<<<Details of S403 of Acquisition of Learning Image Pair>>>

Here, S403 will be described with reference to FIG. 5. First, the stage 105 is controlled and moved, so that the region (hereinafter, referred to as a reference region) designed (or assumed) to form the circuit pattern same as that around the position of the defect to be learned is included in the imaging field of view of the SEM 101 (S501). Note that information with higher accuracy than the design data is not necessary for identifying the reference region. In a semiconductor wafer, a plurality of chips designed to form the same circuit pattern are disposed on the wafer, and thus, as a simplest method, it is conceivable to set a region shifted from the defect coordinates by one chip as the reference region. However, the reference region may be selected by another method.

Next, the reference region on the sample wafer 104 is irradiated and scanned with the electron beam 106, the generated secondary electrons 108 and backscattered electrons 109 are detected by the detector 110 to image the reference region, and a detection signal from the detector 110 obtained by the imaging is processed by the detector control unit 118 to acquire the learning reference image so as to have a size equal to or larger than the size acquired in S401 (S502).

Next, the stage 105 is controlled and moved, so that a region including the defect to be learned (hereinafter, referred to as a defect region) is included in the imaging field of view of the SEM 101 (S503). Next, the defect region on the sample wafer 104 is irradiated and scanned with the electron beam 106, the generated secondary electrons 108 and backscattered electrons 109 are detected by the detector 110 to image the defect region, and a detection signal from the detector 110 obtained by the imaging is processed by the detector control unit 118 to acquire the learning defect image so as to have a size equal to or larger than the size acquired in S401 (S504).

After the learning defect image and the learning reference image are acquired, accessory information is added, so that the learning defect image and the learning reference image are paired and stored in the image storage area 119 (S505).

The above is the description using FIG. 5. Either the learning reference image or the learning defect image may be acquired first. That is, the processes of S501 to S502 may be executed after S503 to S504.

<<<Parallel Process of Learning Sequence and Defect Observation Process>>>

Return to the description of FIG. 4. S404 and S405 described below are processes intended to have merit of performing defect observation even during a time of the learning sequence requiring the time by performing processing necessary for identifying a defect portion and the defect observation in parallel with the learning sequence.

The learning defect image acquired in S403 is compared with the learning reference image, and a defect portion is identified in the same manner as S211 (S404). Next, the identified defect portion is imaged at a high magnification by narrowing the field of view, an observation defect image is acquired, the observation defect image is stored in the image storage area 119, and is excluded from the defects to be observed in S207 to S213 (S405). The processes of S403 to S405 described above are repeatedly executed for all or a part of the defects to be learned of the sample wafer 104.

The above is the parallel process of the learning sequence and the defect observation process.

Finally, a learning end condition of the estimation processing parameters is acquired (S406), and the estimation processing parameter calculation unit 122 calculates the estimation processing parameters for estimating the pseudo reference image (S407: details will be described later).

The above is the description of FIG. 4. Here, with respect to S404 and S405, in addition to the merit of the parallel processing described above, the acquisition of the observation defect image in S212 is not required, and thus S404 and S405 have merit that the sample observation can be efficiently performed. In addition, S404 to S405 may be omitted, and when S404 to S405 are omitted, the defect to be learned is not excluded from the defects to be observed in S207 to S213.

<<<Details of Calculation of Estimation Processing Parameters in S407>>>

The calculation process of the estimation processing parameters in S407 will be described with reference to FIG. 6. In the calculation of the estimation processing parameters, the design data is not necessary, and the learning defect image and the learning reference image are used.

First, similar to S209, the image preprocessing such as the noise removal and the luminance non-uniformity correction is applied to both the learning defect image and learning reference image acquired in S403 (S601). Next, in order to absorb a stage movement error or an electron beam irradiation positioning error, the pair of the learning defect image and the learning reference image are aligned based on a predetermined evaluation value, and alignment amounts AX and AY between the images are obtained (S602). As the predetermined evaluation value, a normalized cross-correlation coefficient, a mean square error, or the like may be used, and the alignment may be performed based on a position at which the evaluation value is maximum or minimum. When image resolutions (the number of pixels per image in the same field of view) are different from each other, the image resolutions are aligned by linear interpolation or the like before the alignment is performed.

Next, based on the alignment amounts, a partial learning defect image is cut out from the learning defect image, and a partial learning reference image is cut out from the learning reference image (S603).

Here, the processes of S601 and S602 will be described with reference to FIG. 7. FIG. 7 shows a learning defect image 701 and a learning reference image 702. In S601, these two images are aligned based on the predetermined evaluation value to obtain an image alignment result 703. In the image alignment result 703, a defect portion included only in the learning defect image 701 is not illustrated. In S602, based on the alignment amounts AX and AY, as a region common to the learning defect image and the learning reference image, a partial learning defect image 704 is cut out from the learning defect image 701 and a partial learning reference image 705 is cut out from the learning reference image 702.

Return to the description of FIG. 6 again. Learning estimation processing parameters are initialized (S604). At this time, previously learned estimation processing parameters may be read from the estimation processing parameter storage area 121 and used as initial values of the learning estimation processing parameters. Next, a pseudo defect image is estimated from the partial learning defect image based on the learning estimation processing parameters (S605), an estimation error between the partial learning reference image and the pseudo defect image is calculated (S606), and the learning estimation processing parameters are updated so that the estimation error becomes small (S607). Next, it is checked whether the learning end condition acquired in S406 is satisfied (S608). When the learning end condition is satisfied, the learning estimation processing parameters are stored in the estimation processing parameter storage area 121 as the estimation processing parameters (S609). When the learning end condition is not satisfied, the process returns to S605 again.

This is the end of the flow in FIG. 6.

For example, the learning end condition may be assumed as follows.

(Learning end condition 1) The estimation error is compared with a preset estimation error threshold value TH, and the estimation error is smaller than the estimation error threshold value TH.

(Learning end condition 2) An operation of ending learning is received from a user.

(Learning end condition 3) The processes from S605 to S608 repeat for a preset specified number of times MR.

<<Application of Neural Network>>

As a method for estimating the pseudo reference image based on the partial learning defect image in S605, a neural network described in Non-Patent Literature 1 may be used. This neural network is also used when the pseudo reference image is estimated from the inspection defect image in S210. Specifically, a U-shaped neural network called U-net as shown in FIG. 8 may be used. Here, Y represents an input image. F11 (Y), F12 (Y), F13 (Y), F21 (Y), F22 (Y), F23 (Y), F24 (Y), F31 (Y), and F32 (Y) represent intermediate data. F (Y) represents an estimation result of the pseudo reference image.

The intermediate data and a final result are calculated by Equations 1 to 10 in FIG. 20. In Equations 1 to 10, "*" represents a convolution operation, DS represents an operation of applying a 2×2 max filter to an input image and reducing the input image to a half in a space (XY) direction, US represents an operation of up-sampling the input image to a size twice in the space direction, and CC represents an operation of combining two input images in a channel direction.

Here, meanings of variables used in Equations 1 to 10 are as follows:

W1 is c1 filters of c0×f1×f1 size c0 is the number of channels of the input image f1 is a size of a spatial filter A c1-dimensional feature map is obtained by convolving the filter of c0×f1×f1 size to the input image for c1 times.

The meanings of the variables used again in Equations 1 to 10 are described below:

B1 is a c1-dimensional vector (bias component corresponding to c1 filters)
W2 is a filter of c1×f2×f2 size
B2 is a c2-dimensional vector
W3 is a filter of c2×f3×f3 size
B3 is a c3-dimensional vector
W4 is a filter of c3×f4×f4 size
B4 is the c2-dimensional vector
W5 is a filter of (c2×2)×f5×f5 size
B5 is the c2-dimensional vector
W6 is a filter of c2×f6×f6 size
B6 is the c1-dimensional vector
W7 is a filter of (c1×2)×f7×f7 size
B7 is a c4-dimensional vector
W8 is a filter of c4×f8×f8 size
B8 is a c5-dimensional vector.

Among the above, c0 and c5 are values determined by the number of channels of the partial learning defect image and the partial learning reference image. Further, f1 to f8 and c1 to c4 are hyperparameters determined by the user before the learning sequence, and may be set to, for example, f1 to f8=3, c1=8, c2=16, c3=32, and c4=64. The parameters calculated by the calculation process of the estimation processing parameters (S405) are W1 to W8 and B1 to B8.

Other configurations may be used as the configuration of the neural network described above. Although a structure of the U-net having a maximum depth of 3 is described in FIG. 8, for example, the depth may be changed, and a network having a maximum depth of 4 or more may be used.

The process (S607) of calculating the estimation error is a process of evaluating a difference (error) between the estimation result F (Y) and the partial learning reference image, and the parameters are updated so that the estimation error obtained in this process becomes small. As a method for quantifying a difference (error) between images, a mean square error or the like may be used.

In the process (S608) of updating the estimation processing parameters, a general error back propagation algorithm may be used in learning of the neural network. In addition, when the estimation error is calculated, all the pairs of the acquired learning defect image and learning reference image may be used, or a mini-batch method may be used. That is, a plurality of image pairs may be randomly extracted from the pairs of the learning defect image and the learning reference image, and the parameters may be repeatedly updated. Further, a patch image may be randomly cut out from one image pair and used as the input image Y of the neural network. As a result, the learning can be efficiently performed.

<GUI>

Next, the GUI displayed on the user interface 111 will be described.

FIG. 9 shows a GUI 900 for setting a size of a learning image in S401. On this GUI 900, an inspection defect image size 901 and an imaging field of view 902 included in the recipe read in S202 are displayed. Further, an input unit 903 for setting a learning image size is displayed on the GUI 900, and after the learning image size is set through the GUI 900, an "OK" button 904 is pressed to execute the process of S402 and the subsequent processes.

Here, a method for determining the learning image size will be described. In the neural network shown in FIG. 8, the input image is reduced to a size (XY direction) of $1/(2^d)$ at a depth d. Therefore, when a neural network having a maximum depth D is used, the input image is required to have a size of $(2^D) \times (2^D)$ or more. Sizes of the partial learning defect image and the partial learning reference image obtained by aligning the learning defect image and the learning reference image in S602 are equal to or smaller than sizes of the learning defect image and the learning reference image, respectively. Specifically, the image size is reduced by the alignment amounts AX and AY. In order to ensure that the sizes of the partial learning defect image and the partial learning reference image are equal to or larger than a size of $(2^D) \times (2^D)$, it is necessary to acquire the learning defect image and the learning reference image each having a size of $(2^D + AX) \times (2^D + AY)$, but the alignment amounts AX and AY cannot be known before the acquisition of the learning defect image and the learning reference image. Since the alignment amounts AX and AY depend on the stage movement error, the electron beam irradiation positioning error, or the like, maximum values MX and MY of the alignment amounts may be obtained based on the stage movement error, the electron beam irradiation positioning error, or the like, and a size of $(2^D + MX) \times (2^D + MY)$ may be set as the learning image size. For example, when the maximum depth of the neural network is 7, MX=50, and MY=30, 178×158 is set as the learning image size.

In addition, without acquiring the size of the learning image in S401, the learning defect image and the learning reference image are acquired in S502 and S504 with the same size as the inspection defect image, the learning defect image and the learning reference image are aligned in S602, and after the partial learning defect image and the partial learning reference image are cut out in S603, it is checked whether at least one size of the partial learning defect image and the partial learning reference image is equal to or larger than a predetermined size, and when the size is smaller than the predetermined size, this image pair may not be used in the processes of S605 to S608. The predetermined size is the size of $(2^D) \times (2^D)$ when the neural network having the maximum depth D is used.

FIG. 10 shows a GUI 1000 for setting the learning end condition in S406. The GUI 1000 displays an input unit 1001 for setting the number of times of the repetitions MR of the processes of S605 to S608, an input unit 1002 for setting the estimation error threshold value TH, and an input unit 1003 for setting whether to receive a learning end operation by the user. After the learning end condition is set through the GUI 1000, a "start learning" button 1004 is pressed to execute the calculation of the estimation processing parameters in S407. When a "cancel" button 1006 is pressed during the calculation of the estimation processing parameters, the calculation of the estimation processing parameters can be interrupted. When a "check progress" button 1005 is pressed during the calculation of the estimation processing parameters, a GUI 1100 for checking a progress of the update process of the learning estimation processing parameters as shown in FIG. 11 is switched. In the GUI 1100, the number of times of the repetitions of the update of the estimation parameters and a transition of the estimation error are displayed in a graph 1101. When an "end learning" button 1103 of the GUI 1100 is pressed, it is regarded that an operation of ending the learning is received from the user, the update of the learning estimation processing parameters is ended, that is, it is determined in S608 that the learning end condition is satisfied. When a "check estimated image" button 1102 of the GUI 1100 is pressed, the GUI 1100 is switched to a GUI 1200 as shown in FIG. 12. By pressing an image ID selection button 1201 on the GUI 1200 to designate the number of an image to be displayed, and selecting a type of an image to be displayed such as a secondary electron image (SE) or a backscattered electron image (BSE) by a channel selection unit 1202, a pseudo defect image estimation process is executed on the designated image ID by using the learning estimation parameters, and a partial learning defect image 1203, an estimated pseudo defect image 1204, and a partial learning reference image 1205 of the designated image ID are displayed. When an "OK" button 1206 of the GUI 1200 is pressed, the GUI 1200 is switched to the display of original GUI 1100 as shown in FIG. 11.

According to the present embodiment, by acquiring the learning defect image and the learning reference image, calculating the estimation processing parameters by using the learning defect image and the learning reference image, and estimating the pseudo reference image based on the inspection defect image in the sample observation, it is possible to omit acquisition of a reference image, and it is possible to improve a throughput of the sample observation.

<Comparison of Sequences of Defect Observation>

FIG. 13 shows sequences when defects to be observed (1) and (2) are sequentially observed in a sample observation system of related art. A horizontal axis represents a time, and a vertical axis represents a defect to be observed.

First, a sequence of a process 1301 related to the observation of the defect to be observed (1) includes:

(S) moving the stage so that a reference region corresponding to the defect to be observed (1) is included in the imaging field of view of the SEM 101;

(RI) acquiring a learning reference image by the SEM 101 imaging the reference region;

(S) moving the stage so that a region including the defect to be observed (1) is included in the imaging field of view of the SEM 101;

(DI) acquiring a learning defect image by the SEM 101 imaging a relatively wide region including the defect to be observed (1);

(D) identifying a defect portion in the learning defect image by using the learning defect image and the learning reference image; and (HI) acquiring an observation defect image by the SEM 101 imaging a relatively narrow region including the identified defect portion.

A same sequence is also included in a process 1302 related to observation of the next defect to be observed (2). Here, it is essential that the stage movement (S) in the process 1302 is performed after the acquisition (HI) of the observation defect image of the defect to be observed (1) is completed. This is because the defect (1) to be observed remains in the imaging field of view of the SEM 101 until the acquisition (HI) of the observation defect image of the defect (1) to be observed is completed in the process 1301.

FIG. 14 is a sequence particularly related to the processes of S207 to S213 of the present embodiment. A relationship between a horizontal axis and a vertical axis is the same as that in FIG. 13. In the sequence of FIG. 14, estimation (P) of a pseudo reference image presents as a time not shown in FIG. 13, while the acquisition (RI) of the reference image is not present. In addition, the number of the stage movements (S) during each process is one.

First, a sequence of a process 1401 related to the observation of the defect to be observed (1) includes:

(S) moving the stage so that the region including defect to be observed (1) is included in the imaging field of view of the SEM 101;

(DI) acquiring an inspection defect image by the SEM 101 imaging the relatively wide region including the defect to be observed (1);

(P) estimating a pseudo reference image from the inspection defect image based on estimation processing parameters;

(D) identifying a defect portion in the inspection defect image by using the inspection defect image and the pseudo reference image; and (HI) acquiring an observation defect image by the SEM 101 imaging a relatively narrow region including the identified defect portion.

Next, in a process 1402 related to the observation of the defect to be observed (2), the same processes are performed on the defect to be observed (2).

As described above, in the sequence of FIG. 14, by estimating (P) the pseudo reference image based on the defect image, the first stage movement (S) and the acquisition (RI) of the reference image of the sequence described in FIG. 13 become unnecessary. Accordingly, it is possible to reduce the number of times of the stage movements to ½, and further, it is possible to omit the imaging of the reference image, and it is possible to improve the throughput when a plurality of defects to be observed on the sample wafer 104 are sequentially observed using the sample observation system.

Second Embodiment

In the first embodiment, the method for improving the throughput of the sample observation using the SEM to image the defect region and the reference region, acquiring the learning defect image and the learning reference image, using the learning defect image and the learning reference image to calculate the estimation processing parameters, and estimating the pseudo reference image based on the inspection defect image in the sample observation is described. During the calculation of the estimation processing parameters, the learning can be performed more efficiently as the number of pairs of the learning defect image and the learning reference image increases. In the present embodiment, a method for calculating the estimation processing parameters by assigning a pseudo defect to a learning reference image to generate a learning defect image and using a pair of the learning reference image and the generated learning defect image even when there is no defect to be learned or a small number of defects to be learned will be described.

A configuration of a sample observation system according to the present embodiment is basically the same as the configuration shown in FIG. 1 described in the first embodiment. Differences are in a processing flow of the learning sequence, and a sample observation flow other than the learning sequence has the same processing flow as the processing flow shown in FIG. 2 described in the first embodiment. A GUI of the sample observation system according to the present embodiment includes interfaces equivalent to those shown in FIGS. 9 to 12 described in the first embodiment. Hereinafter, only portions different from those of the first embodiment will be described.

<Learning Sequence>

The learning sequence of S205 will be described with reference to FIG. 15.

First, a region to be learned is set (S1501). This may be one or more regions designated by the user on the sample wafer, or one or more regions on the sample wafer 104 may be set randomly. However, the region to be learned does not include defect coordinates output from the defect inspection device. Next, the stage 105 is controlled and moved so that the set region to be learned is included in the imaging field of view of the SEM 101 (S1502), the region to be learned on the sample wafer 104 is irradiated and scanned with the electron beam 106, the generated secondary electrons 108 and backscattered electrons 109 are detected by the detector 110 to image the region to be learned, and a detection signal from the detector 110 obtained by the imaging is processed by the detector control unit 118 to acquire a learning reference image (S1503).

Next, a pseudo defect is assigned to the learning reference image, and a learning defect image is generated, such that the learning defect image is acquired (S1504), accessory information is added so that the learning defect image and the learning reference image are paired, and the image pair is stored in the image storage area 119 (S1505). A center position and a size (width and height) of a region PR to which the pseudo defect is assigned may be set randomly in a plane of the learning reference image.

A certain offset may be added to light and shade of the region PR as the pseudo defect. Alternatively, the region PR may be set so as to include an edge of a circuit pattern, and deformation may be applied to the circuit pattern based on an edge strength. As described above, minute defects are simulated, but a huge defect that covers an entire surface of an image may be generated. A type of the pseudo defect is not limited thereto, and various defects may be used as long as the various defects are modeled and generated.

The processes of S1502 to S1505 described above are repeatedly executed for all of the regions to be learned of the sample wafer 104. Next, a learning end condition of the estimation processing parameters is acquired (S1506: corresponding to S406 of FIG. 4), and the estimation processing parameter calculation unit 122 calculates the estimation processing parameters for estimating a pseudo reference image (S1507: corresponding to S407 in FIG. 4).

In the above description, the method in which the image including the pseudo defect generated in S1504 is used as the learning defect image for the calculation of the estimation processing parameters is described, but in addition to the image including the pseudo defect generated in S1504, an image including all the defect coordinates read in S203 or the defect coordinates sampled based on the user designation conditions may be used as the learning defect image, similarly to S403 described in the first embodiment. That is, in S1507, the estimation processing parameters may be calculated using a pair of an image (first defect image) obtained by imaging a region including a defect on the sample wafer 104 and a reference image (first reference image) corresponding to the first defect image, and a pair of a second reference image and an image (second defect image) including a pseudo defect generated based on the second reference image.

According to the present embodiment, the estimation processing parameters can be calculated by assigning a pseudo defect to a learning reference image to generate a learning defect image and using a pair of the learning reference image and the generated learning defect image even when there is no defect to be learned or a small number of defects to be learned. By estimating the pseudo reference image based on the inspection defect image in the sample observation, it is possible to omit the acquisition of the reference image, and it is possible to improve the throughput of the sample observation.

Third Embodiment

The first and second embodiments describe the method for identifying the defect portion in the inspection defect image by using the estimation processing parameters obtained by learning a correspondence relationship between the learning defect image and the learning reference image, estimating the pseudo reference image from the inspection defect image in the sample observation, and comparing the inspection defect image with the pseudo reference image. In the present embodiment, a method of calculating estimation processing parameters for estimating a defect portion in a defect image and estimating the defect portion in an inspection defect image based on the estimation processing parameters will be described.

<System Configuration>

With respect to a configuration of the sample observation system 100 according to the present embodiment, the SEM 101 and the defect inspection device 102 have the same configuration as those shown in FIG. 1 described in the first embodiment, and a difference is in the configuration of the calculator 103. Hereinafter, only portions different from those of the first embodiment will be described.

The calculator 103 of the sample observation system according to the present embodiment will be described with reference to FIG. 16. The storage unit 114 includes the image storage area 119 for storing the digital image generated by the detector control unit 118 together with the accessory information, the recipe storage area 120 for storing the recipe including the information on the device or the manufacturing process, the imaging conditions of the image, and the like, and an estimation processing parameter storage area 1601 for storing parameters related to an estimation process of a defect portion in a defect image. The processing unit 115 includes an estimation processing parameter calculation unit 1602 that calculates estimation processing parameters for estimating a defect portion in a defect image, and a defect portion estimation unit 1603 that estimates the defect portion based on the estimation processing parameters.

<Sample Observation Method>

A sample observation method will be described with reference to FIG. 17. S1701 to S1703 are the same as S201 to S203 in FIG. 2.

In S1704, it is checked whether the estimation processing parameters corresponding to a process in which the sample wafer 104 is processed is stored in the estimation processing parameter storage area 1601, and when the estimation processing parameters are not stored ("ABSENT" in FIG. 17), the estimation processing parameter calculation unit 1602 calculates and stores the estimation processing parameters by a learning sequence described later (S1705). Next, the estimation processing parameters are read from the estimation processing parameter storage area 1601 (S1706).

Next, defects to be observed on the sample wafer 104 are sequentially imaged using the SEM 101, and the following series of observations are performed. Since S1707 to S1709 are the same as S207 to S209 in FIG. 2, a description will be omitted. Next, the defect portion estimation unit 1603 estimates the defect portion in the inspection defect image subjected to the image preprocessing by using the estimation processing parameters (S1710). In the estimation of the defect portion, the design data is not necessary, and the estimation processing parameters and the inspection defect image subjected to the image preprocessing are used. Next, the estimated defect portion is imaged at a large magnification by narrowing the field of view, an observation defect image is acquired (S1711), and the inspection defect image and the observation defect image are stored in the image storage area 119 (S1712). The processes of S1707 to S1712 described above are repeatedly executed for all of the defects to be observed of the sample wafer 104.

<<Learning Sequence>>

The learning sequence of S1705 includes a sequence equivalent to the processing flow shown in FIG. 4 described in the first embodiment except for S407.

A method for calculating the estimation processing parameters corresponding to S407 of FIG. 4 will be described with reference to FIG. 18. In the calculation of the estimation processing parameters, the design data is not necessary, and the learning defect image and the learning reference image are used.

Since S1801 to S1803 are the same as S601 to S603 in FIG. 6, a description will be omitted. Next, a partial learning defect image is compared with a partial learning reference image, a defect portion in the partial learning defect image is identified, and an identified defect portion image indicating the defect portion is obtained (S1804: corresponding to S211 in FIG. 2). In S1804, the learning defect image may be displayed on the GUI without identifying the defect portion by using the learning defect image and the learning reference image, the user may designate the defect portion, and an image in which the designated defect portion and a region other than the designated defect portion can be distinguished may be set as the identified defect portion image. Next, learning estimation processing parameters are initialized (S1805: corresponding to S604 in FIG. 6). At this time, previously learned estimation processing parameters may be read from the estimation processing parameter storage area 1601 and used as initial values of the learning estimation processing parameters.

Next, the defect portion estimation unit 1603 estimates the defect portion from the partial learning defect image based on the learning estimation processing parameters (S1806), obtains an estimated defect portion image, calculates an estimation error using the estimated defect portion image and the identified defect portion image (S1807), and the learning estimation processing parameters are updated so that the estimation error becomes small (S1808: corresponding to S607 in FIG. 6). Next, it is checked whether the learning end condition acquired in S406 is satisfied (S1809: corresponding to S608 in FIG. 6), and when the learning end condition is satisfied, the learning estimation processing parameters are stored in the estimation processing parameter storage area 1601 as the estimation processing parameters (S1810). The learning end condition is as described in the first embodiment. When the learning end condition is not satisfied, the process returns to S1806 again. This is the end of the flow of FIG. 18.

As a method of estimating the defect portion from the partial learning defect image in S1806, a neural network shown in FIG. 19 may be used, and the input image Y is the partial learning defect image and F (Y) is the estimated defect portion image. The estimated defect portion image F (Y) is calculated by Equation 12 in FIG. 21. In Equation 12, F (Y) (x, y, c) represents a value of a pixel in which a coordinate value of the estimated defect portion image F (Y) in an X direction is x, a coordinate value in a Y direction is y, and a channel is c, and the same applies to F15 (Y) (x, y, c). F11 (Y), F12 (Y), F21 (Y), F22 (Y), F23 (Y), F24 (Y), F31 (Y), and F32 (Y) are calculated by Equations 1 to 8 in FIG. 20 described in the first embodiment. In addition, when the estimation error of the defect portion is calculated in S1807, an identified defect portion image DD (single-channel binary image) is converted into a two-channel image MSK by Equation 13 of FIG. 21, and a difference (error) between the image MSK and the estimated defect portion image F (Y) is calculated. As a method for quantifying a difference (error) between images, a mean square error or the like may be used as in S607.

Here, W9 is two filters of (c1×2)×f9×f9 size, and B9 is a two-dimensional vector. f9 is a hyperparameter determined by the user before the learning sequence, and may be set to, for example, f9=3. The parameters calculated by the calculation processes of the estimation processing parameters (S1801 to S1810) are W1 to W6, W9, B1 to B6, and B9.

According to the present embodiment, using the learning defect image to calculate the estimation processing parameters for estimating the defect portion in the defect image, and estimating the defect portion in the inspection defect image based on the estimation processing parameters in the sample observation, it is possible to omit the acquisition of the reference image, and it is possible to improve the throughput of the sample observation.

<Summary>

The following description is made in the above first to third embodiments. Numbers and alphabets covered with parentheses assigned to the following description do not indicate an execution order of the processes.

<<Point of View 1>>

A sample observation system includes a scanning electron microscope and a calculator. In the sample observation system, the calculator:

(1) acquires a plurality of images captured by the scanning electron microscope;

(2) acquires, from the plurality of images, a learning defect image including a defect portion and a learning reference image not including the defect portion;

(3) calculates an estimation processing parameter by using the learning defect image and the learning reference image;

(4) acquires an inspection defect image including a defect portion; and (5) estimates a pseudo reference image by using the estimation processing parameter and the inspection defect image.

<<Point of View 2>>

In the sample observation system according to point of view 1, the calculator:

(6) compares the pseudo reference image with the inspection defect image, and identifies the defect portion of the inspection defect image.

<<Point of View 3>>

In the sample observation system according to point of view 1, as the process (3), the calculator:

(3A) aligns the learning defect image and the learning reference image based on a predetermined evaluation value to acquire an alignment amount;

(3B) cuts out a partial learning defect image from the learning defect image based on the alignment amount;

(3C) cuts out a partial learning reference image from the learning reference image based on the alignment amount; and (3D) calculates the estimation processing parameter by using the partial learning defect image and the partial learning reference image.

<<Point of View 4>>

In the sample observation system according to point of view 1, the estimation processing parameter is a parameter of a neural network, in the neural network, a minimum size of an image input to an input layer is a first size, and
as the process (1), the calculator:
acquires the plurality of images each having a size equal to or larger than the first size.

<<Point of View 5>>

In the sample observation system according to point of view 3,
the estimation processing parameter is a parameter of a neural network,
in the neural network, a minimum size of an image input to an input layer is a first size, and
as the process (3), the calculator:
(3E) checks whether at least one size of the partial learning defect image and the partial learning reference image is equal to or larger than the first size.

<<Point of View 6>>

In the sample observation system according to point of view 1,
the calculator acquires an end condition of the calculation process of the estimation processing parameter, and
as the process (3), the calculator:
(3F) ends an update of the estimation processing parameter when it is detected that the end condition is satisfied.

<<Point of View 7>>

In the sample observation system according to point of view 6,
in parallel with the calculation of the estimation processing parameter, the calculator:
(7) compares the learning defect image with the learning reference image to identify a defect portion of the learning defect image.

<<Point of View 8>>

In the sample observation system according to point of view 1,
the calculator omits acquisition of a reference image corresponding to the inspection defect image.

<<Point of View 9>>

A sample observation system includes: a scanning electron microscope and a calculator. In the sample observation system, the calculator:
acquires a plurality of images captured by the scanning electron microscope;
acquires, from the plurality of images, a learning defect image including a defect portion;
calculates an estimation processing parameter by using the learning defect image;
acquires an inspection defect image including a defect portion; and
estimates the defect portion in the inspection defect image by using the estimation processing parameter and the inspection defect image.

It has been described that the processes described above may be implemented by the processing unit executing the image processing program. The image processing program may be distributed by a calculator-readable storage medium or may be distributed from a distribution server calculator. Here, the distribution server calculator includes a storage unit, a calculation unit, and the network interface 112. A specific example of each unit may be the same as that of the calculator 103. The image processing program may be stored in the storage unit of the distribution server calculator having such a configuration, and the processing unit may read the image processing program in response to a distribution request from the calculator 103 and transmit the image processing program to the calculator 103 via the network interface 112.

REFERENCE SIGNS LIST

100: sample observation system
101: SEM
102: defect inspection device
103: calculator

The invention claimed is:

1. A sample observation system comprising:
a scanning electron microscope; and
a calculator, wherein
the calculator:
(1) acquires a plurality of images captured by the scanning electron microscope;
(2) acquires, from the plurality of images, a learning defect image including a defect portion and a learning reference image not including the defect portion;
(3) calculates an estimation processing parameter by using the learning defect image and the learning reference image;
(4) acquires an inspection defect image including a defect portion; and
(5) estimates a pseudo reference image by using the estimation processing parameter and the inspection defect image, and
the process (3) includes:
(3A) aligning the learning defect image and the learning reference image based on a predetermined evaluation value to acquire an alignment amount;
(3B) cutting out a partial learning defect image from the learning defect image based on the alignment amount;
(3C) cutting out a partial learning reference image from the learning reference image based on the alignment amount; and
(3D) calculating the estimation processing parameter by using the partial learning defect image and the partial learning reference image.

2. The sample observation system according to claim 1, wherein
the calculator:
(6) compares the pseudo reference image with the inspection defect image, and identifies the defect portion of the inspection defect image.

3. The sample observation system according to claim 1, wherein
the estimation processing parameter is a parameter of a neural network,
in the neural network, a minimum size of an image input to an input layer is a first size, and
as the process (1), the calculator:
acquires the plurality of images each having a size equal to or larger than the first size.

4. The sample observation system according to claim 1, wherein
the estimation processing parameter is a parameter of a neural network,
in the neural network, a minimum size of an image input to an input layer is a first size,
the scanning electron microscope sets a size of a captured image based on the first size and a maximum value of the alignment amount, and captures a plurality of images based on the set size, and the maximum value of the alignment amount is obtained based on (A1) a stage movement error and (A2) an electron beam irradiation positioning error of the scanning electron microscope.

5. The sample observation system according to claim 1, wherein
the calculator acquires an end condition of the calculation process of the estimation processing parameter, and
as the process (3), the calculator:
(3F) ends an update of the estimation processing parameter when it is detected that the end condition is satisfied.

6. The sample observation system according to claim 5, wherein
in parallel with the calculation of the estimation processing parameter, the calculator:
(7) compares the learning defect image with the learning reference image to identify the defect portion of the learning defect image.

7. The sample observation system according to claim 1, wherein
the calculator omits acquisition of a reference image corresponding to the inspection defect image.

8. A sample observation system comprising:
a scanning electron microscope; and
a calculator, wherein
the calculator:
acquires a plurality of images captured by the scanning electron microscope;
acquires, from the plurality of images, a learning defect image including a defect portion;
calculates an estimation processing parameter by using the learning defect image;
acquires an inspection defect image including a defect portion; and
estimates the defect portion in the inspection defect image by using the estimation processing parameter and the inspection defect image, and
in the calculation of the estimation processing parameter,
the learning defect image and the learning reference image are aligned based on a predetermined evaluation value to acquire an alignment amount,
a partial learning defect image is cut out from the learning defect image based on the alignment amount,
a partial learning reference image is cut out from the learning reference image based on the alignment amount, and
the estimation processing parameter is calculated by using the partial learning defect image and the partial learning reference image.

9. An image processing method executed by a calculator, the image processing method comprising:
(M1) acquiring a plurality of images captured by a scanning electron microscope;
(M2) acquiring, from the plurality of images, a learning defect image including a defect portion and a learning reference image not including the defect portion;
(M3) calculating an estimation processing parameter by using the learning defect image and the learning reference image;
(M4) acquiring an inspection defect image including a defect candidate portion; and
(M5) estimating a pseudo reference image by using the estimation processing parameter and the inspection defect image, wherein the (M3) includes:
(M3A) aligning the learning defect image and the learning reference image based on a predetermined evaluation value to acquire an alignment amount;
(M3B) cutting out a partial learning defect image from the learning defect image based on the alignment amount;
(M3C) cutting out a partial learning reference image from the learning reference image based on the alignment amount; and
(M3D) calculating the estimation processing parameter by using the partial learning defect image and the partial learning reference image.

10. The image processing method according to claim 9, further comprising:
(M6) comparing the pseudo reference image with the inspection defect image, and identifying a defect portion of the inspection defect image.

11. The image processing method according to claim 9, wherein
the estimation processing parameter is a weight value of a neural network,
in the neural network, a minimum size of an image input to an input layer is a first size, and
the (M1) includes:
acquiring the plurality of images each having a size equal to or larger than the first size.

12. The image processing method according to claim 9, wherein
the estimation processing parameter is a weight value of a neural network,
in the neural network, a minimum size of an image input to an input layer is a first size,
the scanning electron microscope sets a size of a captured image based on the first size and a maximum value of the alignment amount, and captures a plurality of images based on the set size, and
the maximum value of the alignment amount is obtained based on (A1) a stage movement error and (A2) an electron beam irradiation positioning error of the scanning electron microscope.

13. The image processing method according to claim 9, wherein
an end condition of the estimation process of the estimation processing parameter is acquired, and
the (M3) includes:
(M3F) ending an update of the estimation processing parameter when it is detected that the end condition is satisfied.

14. The image processing method according to claim 13, further comprising:
(M7) comparing the learning defect image with the learning reference image to identify the defect portion of the learning defect image in parallel with the calculation of the estimation processing parameter.

15. The image processing method according to claim 9, wherein
acquisition of a reference image corresponding to the inspection defect image is omitted.

16. The sample observation system according to claim 1, wherein
the learning reference image is an image of a region designed to form a circuit pattern same as a circuit pattern captured in the learning defect image, and
a coordinate difference between the learning reference image and the learning defect image when the alignment is performed by the process (3A) is acquired as the alignment amount.

17. The sample observation system according to claim 16, wherein
the learning reference image is an image of a region of a circuit pattern formed on a chip shifted by one chip from a chip, on which a circuit pattern captured in the learning defect image is formed, in a plurality of same chips disposed on a wafer imaged by the scanning electron microscope.

18. The image processing method according to claim 9, wherein
the learning reference image is an image of a region designed to form a circuit pattern same as a circuit pattern captured in the learning defect image, and
a coordinate difference between the learning reference image and the learning defect image when the alignment is performed by the process (M3A) is acquired as the alignment amount.

19. The sample observation system according to claim 18, wherein
the learning reference image is an image of a region of a circuit pattern formed on a chip shifted by one chip from a chip, on which a circuit pattern captured in the learning defect image is formed, in a plurality of same chips disposed on a wafer imaged by the scanning electron microscope.

* * * * *